(12) United States Patent
Ochiai

(10) Patent No.: US 12,650,457 B2
(45) Date of Patent: Jun. 9, 2026

(54) SEMICONDUCTOR APPARATUS, IMAGE CAPTURING APPARATUS, IMAGE CAPTURING SYSTEM, AND MOVING OBJECT

(71) Applicant: CANON KABUSHIKI KAISHA, Tokyo (JP)

(72) Inventor: Kei Ochiai, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 18/595,526

(22) Filed: Mar. 5, 2024

(65) Prior Publication Data

US 2024/0210463 A1      Jun. 27, 2024

Related U.S. Application Data

(63) Continuation of application No. 17/003,056, filed on Aug. 26, 2020, now Pat. No. 11,953,541, which is a
(Continued)

(30) Foreign Application Priority Data

Feb. 27, 2018     (JP) ................................. 2018-033807
Feb. 27, 2018     (JP) ................................. 2018-033808

(51) Int. Cl.
*G01R 31/26*          (2020.01)
*B60K 35/29*          (2024.01)
*H10F 39/18*          (2025.01)

(52) U.S. Cl.
CPC .......... *G01R 31/2642* (2013.01); *B60K 35/29* (2024.01); *G01R 31/2635* (2013.01); *H10F 39/18* (2025.01); *B60K 2360/48* (2024.01)

(58) Field of Classification Search
CPC ................................................ G01R 31/2642
See application file for complete search history.

(56) References Cited

U.S. PATENT DOCUMENTS

| | | | |
|---|---|---|---|
| 6,215,897 B1* | 4/2001 | Beer ..................... H01L 21/681 | |
| | | | 348/87 |
| 7,440,017 B2 | 10/2008 | Endo et al. | |
| 2008/0036487 A1 | 2/2008 | Bradley | |
| 2009/0254287 A1 | 10/2009 | Ohgoh | |
| 2009/0287909 A1 | 11/2009 | Vera | |
| 2010/0114543 A1* | 5/2010 | Namba ................. G06F 30/367 | |
| | | | 703/4 |

(Continued)

FOREIGN PATENT DOCUMENTS

| | | |
|---|---|---|
| CN | 102498713 A | 6/2012 |
| JP | 2010122055 A | 6/2010 |

(Continued)

OTHER PUBLICATIONS

Written Opinion and International Search Report issued in corresponding parent International Application No. PCT/JP2019/002746 dated Apr. 23, 2019.

(Continued)

*Primary Examiner* — Thanh Luu
(74) *Attorney, Agent, or Firm* — Venable LLP

(57) ABSTRACT
A semiconductor apparatus includes a semiconductor device that performs signal processing, a driving control unit that controls drive of the semiconductor device, and a lifetime obtaining unit that obtains remaining lifetime information that represents a remaining lifetime of the semiconductor device. In a case where the remaining lifetime information represents a first length, the driving control unit drives the semiconductor device in a first condition. In a case where the remaining lifetime information represents a second length shorter than the first length, the driving control unit drives the semiconductor device in a second condition in which throughput of the signal processing is lower than that in a case where the semiconductor device is driven in the first condition, and the remaining lifetime of the semiconductor device is longer than that in the case where the semiconductor device is driven in the first condition.

22 Claims, 14 Drawing Sheets

Related U.S. Application Data continuation of application No. PCT/JP2019/002746, filed on Jan. 28, 2019.

(56) References Cited

U.S. PATENT DOCUMENTS

| | | | | |
|---|---|---|---|---|
| 2010/0188543 | A1 | 7/2010 | Oike | |
| 2011/0202554 | A1 | 8/2011 | Powilleit | |
| 2012/0057303 | A1* | 3/2012 | Tsai | G06F 1/206 |
| | | | | 361/704 |
| 2015/0377955 | A1 | 12/2015 | Shapira | |
| 2016/0266819 | A1 | 9/2016 | Sundell | |
| 2017/0277455 | A1 | 9/2017 | Sunada | |
| 2019/0268591 | A1* | 8/2019 | Takayama | H04N 23/50 |
| 2019/0268995 | A1* | 8/2019 | Horie | H05B 45/58 |

FOREIGN PATENT DOCUMENTS

| | | | |
|---|---|---|---|
| JP | 2017169145 | A | 9/2017 |
| JP | 2017173242 | A | 9/2017 |

OTHER PUBLICATIONS

Extended European Search Report issued on Oct. 15, 2021 in corresponding European Patent Appln. No. 19761044.7.

Kurokawa et al., "Reasonable Circuit Analysis Considering Comprehensively Reliability and Variability," 13th International Symposium on Communications and Information Technologies, 2013, XP032514061.

Li et al., "Compact Modeling of MOSFET Wearout Mechanisms for Circuit-Reliability Simulation," IEEE Transactions on Device and Materials Reliability, vol. 8, No. 1, Mar. 2008, XP011347899.

Huang et al., "Hardware Error Likelihood Induced by the Operation of Software," IEEE Transactions on Reliability, vol. 60, No. 3, Sep. 2011, XP011382350.

Bernstein et al., "Electronic circuit reliability modeling," Microelectronics Reliability 46, 2006, XP005668919.

Chinese Office Action issued on Apr. 29, 2022 in corresponding Chinese Patent Appln. No. 201980015111.0.

* cited by examiner

FIG. 2

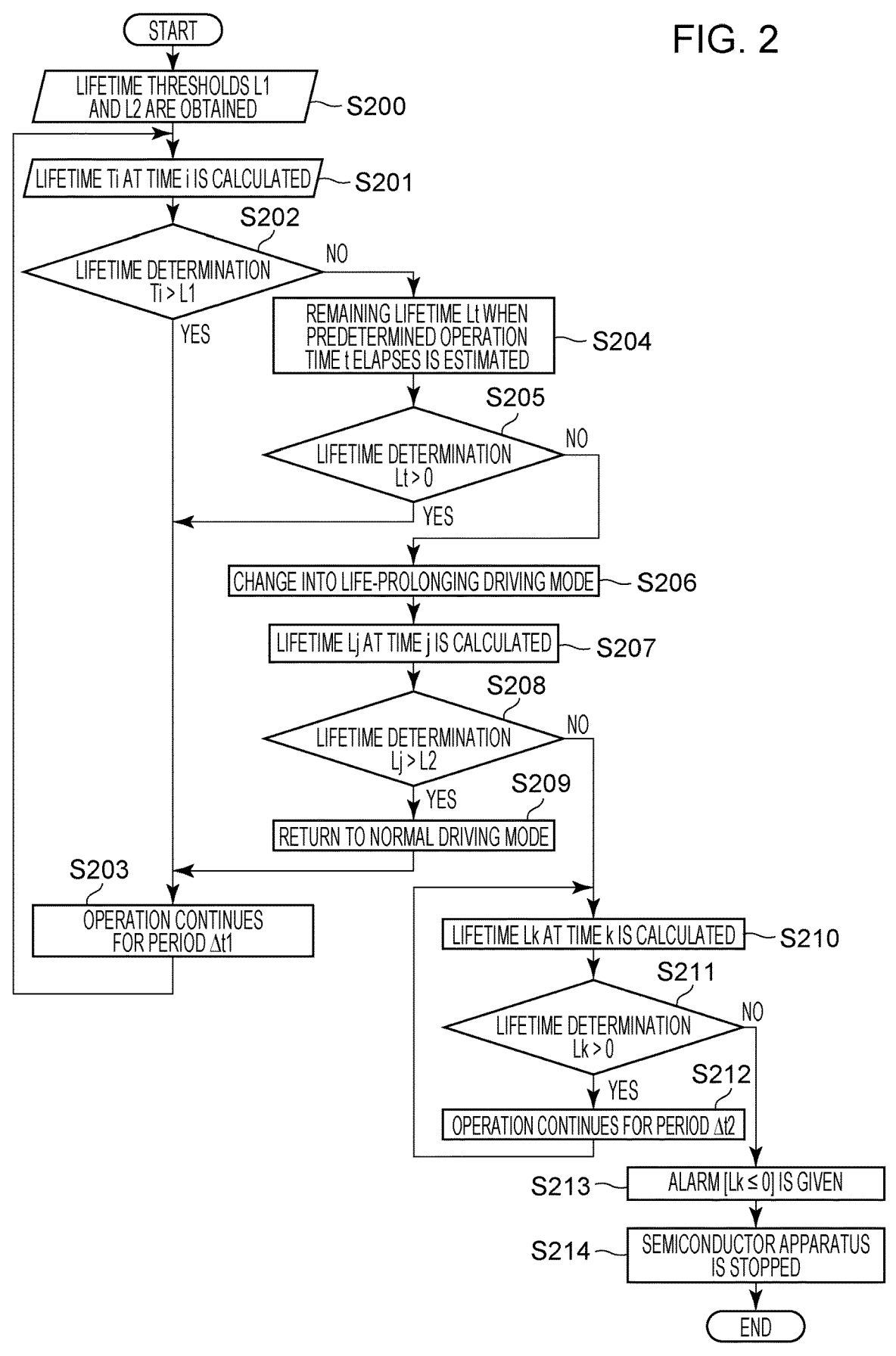

START

LIFETIME THRESHOLDS L1 AND L2 ARE OBTAINED — S200

LIFETIME Ti AT TIME i IS CALCULATED — S201

S202

LIFETIME DETERMINATION $T_i > L_1$

NO

REMAINING LIFETIME Lt WHEN PREDETERMINED OPERATION TIME t ELAPSES IS ESTIMATED — S204

S205

LIFETIME DETERMINATION $L_t > 0$

NO

YES

CHANGE INTO LIFE-PROLONGING DRIVING MODE — S206

LIFETIME Lj AT TIME j IS CALCULATED — S207

S208

LIFETIME DETERMINATION $L_j > L_2$

NO

YES

S209

RETURN TO NORMAL DRIVING MODE

S203

OPERATION CONTINUES FOR PERIOD $\Delta t1$

LIFETIME Lk AT TIME k IS CALCULATED — S210

S211

LIFETIME DETERMINATION $L_k > 0$

NO

YES

S212

OPERATION CONTINUES FOR PERIOD $\Delta t2$

S213 — ALARM [$L_k \leq 0$] IS GIVEN

S214 — SEMICONDUCTOR APPARATUS IS STOPPED

END

FIG. 11B
FRONT VIEW
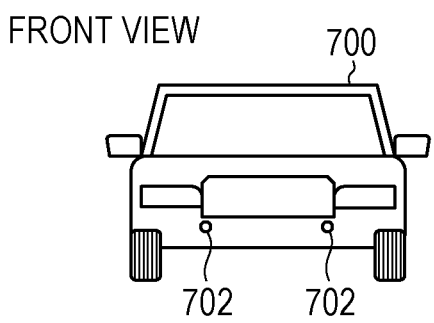
TOP VIEW
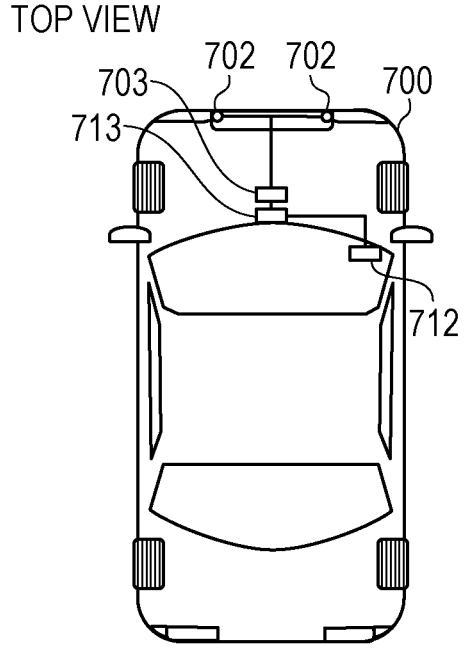
REAR VIEW
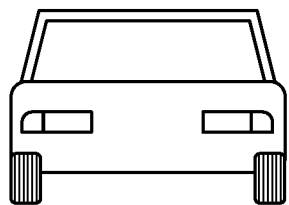

SEMICONDUCTOR APPARATUS, IMAGE CAPTURING APPARATUS, IMAGE CAPTURING SYSTEM, AND MOVING OBJECT

CROSS-REFERENCE TO RELATED APPLICATIONS

This application is a Continuation of U.S. patent application Ser. No. 17/003,056, filed Aug. 26, 2020, which is a Continuation of International Patent Application No. PCT/JP2019/002746, filed Jan. 28, 2019, which claims the benefit of Japanese Patent Application No. 2018-033808, filed Feb. 27, 2018, and Japanese patent Application No. 2018-033807, filed Feb. 27, 2018, all of which are hereby incorporated by reference herein in their entirety.

BACKGROUND OF THE INVENTION

Field of the Invention

The present invention relates to a semiconductor apparatus, an image capturing system, and a moving object.

Background Art

In recent years, various kinds of semiconductor apparatuses have been used. As the operation period of a semiconductor apparatus increases, a loss of the function of the semiconductor apparatus is more likely to occur.

For example, as for a technique disclosed in PTL 1, there is a description of a semiconductor apparatus that includes a lifetime estimating unit that obtains the degradation degree of a functional unit of the semiconductor apparatus and that estimates the lifetime of the semiconductor apparatus from the degradation degree. According to PTL 1, when a threshold voltage increases due to the degradation of a semiconductor device, a power supply voltage Vdd is increased. This enables the lifetime of the functional unit to be increased.

In the technique disclosed in PTL 1, drive for increasing the power supply voltage is carried out to increase the lifetime of the semiconductor apparatus. In some cases, however, an increase in the power supply voltage results in a decrease in the lifetime of the semiconductor apparatus, and the drive is not optimal for increasing the lifetime of the semiconductor apparatus. In addition, estimation of the lifetime of an image capturing apparatus is not considered at all.

According to the present invention, drive for increasing the remaining lifetime of a semiconductor apparatus is considered.

CITATION LIST

Patent Literature

PTL 1: Japanese Patent Laid-Open No. 2017-173242

SUMMARY OF THE INVENTION

The present invention has been accomplished in view of the above problem. According to an aspect thereof, a semiconductor apparatus includes a semiconductor device that performs signal processing, a driving control unit that controls drive of the semiconductor device, and a lifetime obtaining unit that obtains remaining lifetime information that represents a remaining lifetime of the semiconductor device. In a case where the remaining lifetime information represents a first length, the driving control unit drives the semiconductor device in a first condition. In a case where the remaining lifetime information represents a second length shorter than the first length, the driving control unit drives the semiconductor device in a second condition in which throughput of the signal processing is lower than that in a case where the semiconductor device is driven in the first condition, and the remaining lifetime of the semiconductor device is longer than that in the case where the semiconductor device is driven in the first condition.

According to another aspect, an image capturing apparatus includes pixels that are arranged in rows and in columns and that include respective photoelectric converters, an image sensor that performs an image capturing operation for reading signals of the pixels, and a lifetime estimating unit that obtains remaining lifetime information on the image sensor. The image sensor performs the image capturing operation multiple times. The lifetime estimating unit obtains the remaining lifetime information after the image capturing operation is performed multiple times.

Further features of the present invention will become apparent from the following description of exemplary embodiments with reference to the attached drawings.

BRIEF DESCRIPTION OF THE DRAWINGS

FIG. 2 is a flowchart illustrating the operation of the semiconductor apparatus.

FIG. 11B illustrates the structure of the moving object.

DESCRIPTION OF THE EMBODIMENTS

Embodiments will hereinafter be described with reference to the drawings. In the following description, a transistor is an N-type transistor, provided that there is no notification. However, the embodiments described below are not limited to an N-type transistor, a P-type transistor may be appropriately used. In this case, the voltage of a gate, a source, and a drain of the transistor can be appropriately changed from those in the description according to the embodiments. For example, in the case of a transistor that operates as a switch, the low level and the high level of a voltage that is applied to the gate are inverted in comparison with the description according to the embodiments.

First Embodiment

Figure 1:
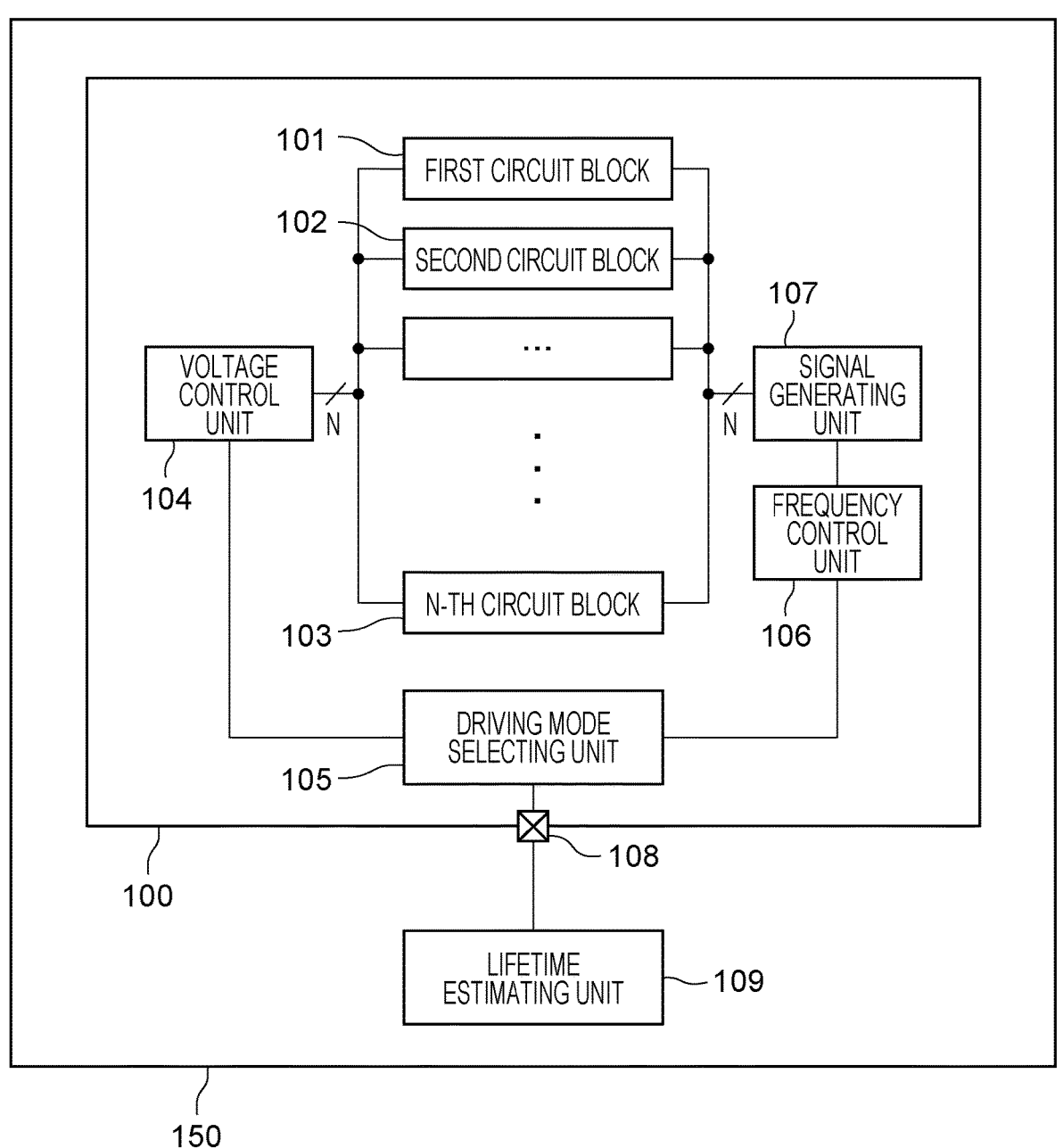
FIG. 1 illustrates the structure of a semiconductor apparatus.

FIG. 1 illustrates an example of the structure of a semiconductor apparatus according to the present embodiment. A semiconductor apparatus 150 includes a semiconductor device 100 and a lifetime estimating unit 109. The semiconductor device 100 is a circuit that has many functions such as light reception, light emission, AD conversion processing, signal processing, communication processing, a storage unit, and a detection unit. The structure and the operation of the semiconductor device 100 will now be described.

A first circuit block 101, a second circuit block 102, and a N-th circuit block 103 are circuits that have many functions such as light reception, light emission, AD conversion processing, signal processing, communication processing, a storage unit, and a detection unit.

A voltage control unit 104 supplies, to the first circuit block 101, the second circuit block 102, and the N-th circuit block 103, a voltage value that is set by using a signal from a driving mode selecting unit 105 that corresponds to a driving control unit.

When the voltage value that is supplied by the voltage control unit 104 is zero, all or a part of the first circuit block 101, the second circuit block 102, and the N-th circuit block 103 are turned off.

By using the signal from the driving mode selecting unit 105, a frequency control unit 106 changes a period in which a signal generating unit 107 generates control signals that are to be transmitted to the first circuit block 101, the second circuit block 102, and the N-th circuit block 103.

The driving mode selecting unit 105 receives remaining lifetime information from the lifetime estimating unit 109 that corresponds to a lifetime obtaining unit described later via a lifetime information receiving unit 108. The voltage control unit 104 and the frequency control unit 106 are controlled depending on the information. The driving mode selecting unit 105 can generate a control signal that enables all or a part of the first circuit block 101, the second circuit block 102, and the N-th circuit block 103 to be stopped.

The lifetime estimating unit 109 estimates the lifetime of the semiconductor device 100, based on information that represents the latest state of the operation of the semiconductor device 100 or history information in relation to the state of the operation and obtains the remaining lifetime information on the semiconductor device 100. That is, the lifetime estimating unit 109 corresponds to the lifetime obtaining unit that obtains the lifetime information. The state of the operation means a state in which the semiconductor device 100 operates such as an operation voltage or an operating frequency at which the semiconductor device 100 operates or a state caused as a result of the operation such as a temperature. The information that represents the latest state of the operation of the semiconductor device 100 and the history information in relation to the state of the operation are operation information that represents the state of the operation of the semiconductor device 100.

An example of a method of estimating the lifetime of the semiconductor device 100 that is performed by the lifetime estimating unit 109 will now be described. The lifetime of the semiconductor apparatus is typically limited because the performance of a transistor, a wiring line, and an oxide film that are included in the semiconductor apparatus impairs over time. Main mechanisms of the impairment in the performance of the semiconductor apparatus include electromigration (EM) and time dependent dielectric breakdown (TDDB). Other mechanisms of the impairment in the performance include variations in characteristics due to hot carrier injection (HC) and negative bias temperature instability (NBTI).

A remaining lifetime LT (EM) when a factor in the impairment in the performance is EM is calculated by using the following expression (1):

$$LT\,(EM) = A \times J^{-n} \times \exp\,(Ea/kT). \qquad (1)$$

Here, A is a coefficient that depends on a manufacturing process, Ea is an activation energy, J is the current density of the wiring line, n is a current acceleration factor, k is the Boltzmann constant, and T is the temperature of the wiring line.

A remaining lifetime LT (TDDB) when the factor in the impairment in the performance is TDDB is calculated by using the following expression (2):

$$LT\,(TDDB) = A \times \exp\,(-\gamma Vg \times Vg) \times \exp\,(Ea/kT). \qquad (2)$$

Here, Vg is a voltage that is applied to the gate of the transistor, and γVg is a voltage acceleration factor.

A remaining lifetime LT (HC) when the factor in the impairment in the performance is HC is calculated by using the following expression (3):

$$LT\,(HC) = A \times Isub^{-m} \times \exp\,(Ea/kT). \qquad (3)$$

Here, Isub is the maximum substrate current that flows through a semiconductor substrate, and m is a coefficient that depends on the substrate current.

A remaining lifetime LT (NBTI) when the factor in the impairment in the performance of the semiconductor device 100 is NBTI is calculated by using the following expression (4):

$$LT\,(NBTI) = A \times Vg^n \times \exp\,(Ea/kT). \qquad (4)$$

The lifetime estimating unit 109 measures all or a part of coefficients in expression (1) to expression (4) and calculates the remaining lifetime of the semiconductor device 100. The lifetime estimating unit 109 may be located inside the semiconductor device 100.

Figure 3A:
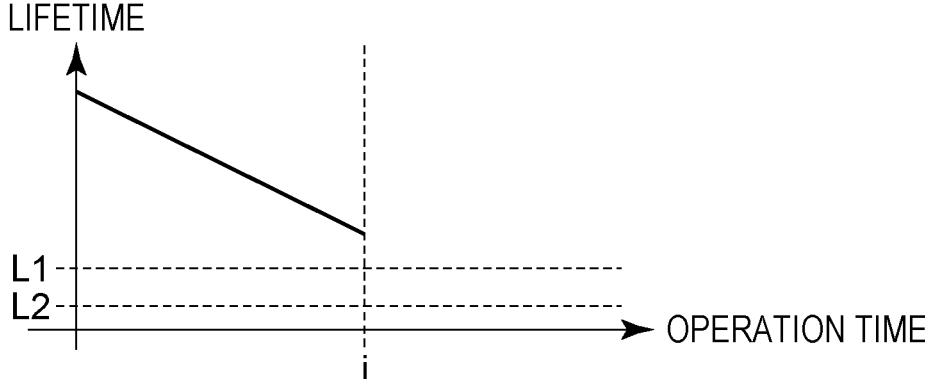
FIG. 3A illustrates a relationship between the operation time and the lifetime of the semiconductor apparatus.

Examples of operations according to the present invention will be described below with reference to a flowchart in FIG. 2 and timing charts in FIGS. 3A to 3E. An example of an operation corresponding to a timing chart in FIG. 3A will now be described. FIG. 3A illustrates a relationship between the operation time of the semiconductor device 100 and the remaining lifetime of the semiconductor device 100 by a solid line.

At S200, the driving mode selecting unit 105 obtains a first lifetime threshold L1 and a second lifetime threshold L2 of the semiconductor device 100. The first lifetime threshold L1 and the second lifetime threshold L2 are determined as thresholds for the remaining lifetime of the semiconductor device 100, and L1>L2>0 is satisfied.

At S201, the lifetime estimating unit 109 calculates the remaining lifetime Ti of the semiconductor device 100 at time i.

At S202, the driving mode selecting unit 105 compares the first lifetime threshold L1 and the remaining lifetime Ti at time i. If Ti>L1 is satisfied, processing proceeds to S203. If Ti≤L1 is satisfied, the processing proceeds to S204.

FIG. 3A illustrates the case where Ti>L1 is satisfied.

At S203, a process of continuing the operation of the semiconductor device 100 for a freely determined period Δt1 is performed, and subsequently, the processing returns to S201.

In the above flow, the remaining lifetime of the semiconductor device 100 is longer than the first lifetime threshold L1. The semiconductor device 100 has an enough remaining lifetime, and the driving state of the semiconductor device 100 is not changed.

The case in FIG. 3B when operation time elapses after that in FIG. 3A will now be described.

Figure 3B:
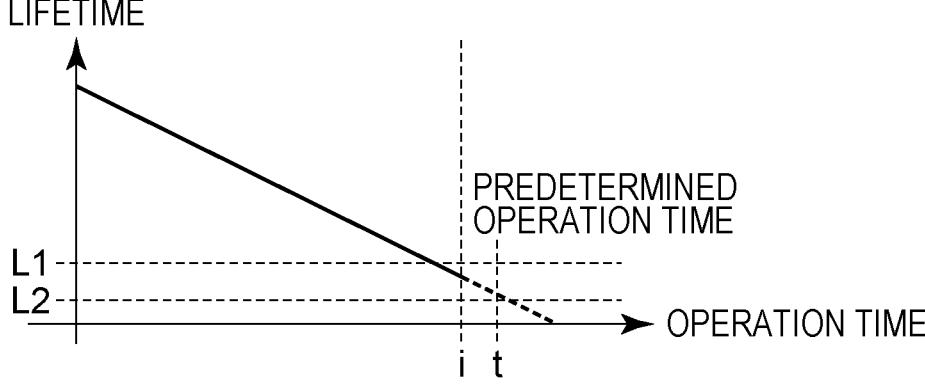
FIG. 3B illustrates a relationship between the operation time and the lifetime of the semiconductor apparatus.

FIG. 3B illustrates the relationship between the operation time of the semiconductor device 100 and the remaining lifetime of the semiconductor device 100 by a solid line. A dashed line represents an estimated remaining lifetime of the semiconductor device 100 that is estimated by the lifetime estimating unit 109 at time i with respect to the operation time of the semiconductor device 100.

FIG. 3B illustrates the case where Ti≤L1 is satisfied.

At S204, the lifetime estimating unit 109 estimates the remaining lifetime Lt when predetermined operation time t of the semiconductor device 100 elapses. For example, the predetermined operation time is time until the semiconductor device 100 spends a lifetime that is estimated in advance. After the operation time exceeds the time, the operation of the semiconductor device 100 is not guaranteed.

At S205, whether the remaining lifetime Lt when the predetermined operation time t of the semiconductor device 100 elapses is more than 0 is determined. If Lt>0 is satisfied, the processing proceeds to S203. If Lt≤0 is satisfied, the processing proceeds to S206. FIG. 3B illustrates the case where Lt>0 is satisfied.

The case where Lt>0 is satisfied means the case where the semiconductor device 100 does not spend the lifetime even after a normal driving mode continues until the predetermined operation time t. Accordingly, the driving mode selecting unit 105 does not change the driving mode of the semiconductor device 100.

The processing proceeds to S203, and a process of continuing the operation of the semiconductor device 100 in the normal driving mode for a freely determined period Δt1 is performed. Subsequently, the processing returns to S201.

In the case in FIG. 3B, the normal driving mode continues until the predetermined operation time t of the driving mode of the semiconductor device 100 as described above.

The case in FIG. 3C will now be described.

Figure 3C:
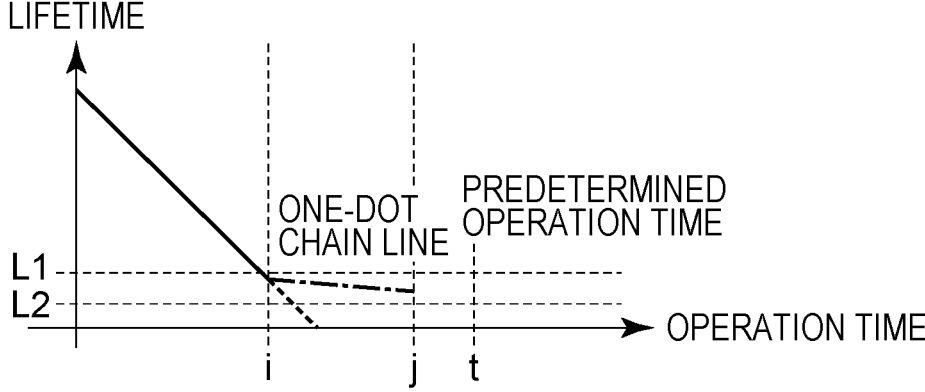
FIG. 3C illustrates a relationship between the operation time and the lifetime of the semiconductor apparatus.

The case in FIG. 3C corresponds to an example in which the semiconductor device 100 spends the lifetime before the predetermined operation time t when the operation in the normal driving mode continues after time i. That is, the result of determination whether Lt>0 is satisfied is No in a process at S205.

FIG. 3C illustrates the relationship between the operation time of the semiconductor device 100 and the remaining lifetime of the semiconductor device 100 by a solid line. A dashed line represents an estimated remaining lifetime of the semiconductor device 100 that is estimated by the lifetime estimating unit 109 at time i with respect to the operation time of the semiconductor device 100. A one-dot chain line represents a relationship between the operation time of the semiconductor device 100 and the remaining lifetime of the semiconductor device 100 in a changed driving state after the driving state of the semiconductor device 100 is changed at time i.

At S205 in FIG. 2, it is determined to be No in the case in FIG. 3C. Accordingly, the processing proceeds to S206.

At S206 in FIG. 2, the driving mode selecting unit 105 controls the operation of both of the voltage control unit 104 and the frequency control unit 106 or either of them and selects a life-prolonging driving mode in which the remaining lifetime of the semiconductor device 100 is longer than the remaining lifetime at time i. The life-prolonging driving mode corresponds to a condition in which the throughput of signal processing is less than that in the case where the semiconductor device 100 is driven in the normal driving mode. In the driving mode, the remaining lifetime of the semiconductor device 100 is longer than that in the case where the semiconductor device 100 is driven in the normal driving mode. That is, the normal driving mode corresponds to a first condition in which the driving control unit drives the semiconductor device 100. The life-prolonging driving mode corresponds to a second condition in which the throughput of the signal processing is less than that in the case where the semiconductor device 100 is driven in the first condition and the remaining lifetime of the semiconductor device is longer than that in the case where the semiconductor device 100 is driven in the first condition.

An example of a method of selecting the life-prolonging driving mode of the semiconductor device 100 by the driving mode selecting unit 105 will now be described. As defined as expression (1) to expression (4) according to the first embodiment, the lifetime of the semiconductor apparatus is limited by the current density J of the wiring line, the temperature T of the wiring line, the voltage Vg that is applied to the gate of the transistor, and the maximum substrate current Isub that flows through the semiconductor substrate. The driving mode selecting unit 105 controls both of the voltage control unit 104 and the frequency control unit 106 or either of them such that the remaining lifetime of the semiconductor device 100 increases. Specifically, the state of the operation is changed such that the values of all or a part of the current density J, the temperature T of the wiring line, the voltage Vg that is applied to the gate of the transistor, and the maximum substrate current Isub that flows through the semiconductor substrate are lower than the normal driving mode. The change in the state of the operation can be said to be a change for reducing a drive ability through which the semiconductor device 100 is driven. For example, the absolute values of the power supply voltages that are supplied to the first circuit block 101, the second circuit block 102, and the N-th circuit block 103 by the voltage control unit 104 are decreased (typically, the power supply voltages are decreased). This enables the current density J, the temperature T of the wiring line, and the voltage Vg to be decreased. The temperature T of the wiring line and the substrate current Isub can be decreased by increasing a period in which the signal generating unit 107 generates a signal by using the frequency control unit 106. At this time, the driving mode selecting unit 105 controls the voltage control unit 104 and the frequency control unit 106 such that the operation of the semiconductor device 100 can continue.

In the normal driving mode, the semiconductor device 100 is driven in the first condition as described above. In the life-prolonging driving mode, the semiconductor device 100 is driven in the second condition in which the lifetime of the semiconductor device 100 is longer than that in the case where the semiconductor device 100 continue to be driven in the normal driving mode as described above.

In some cases where the mode is changed into the life-prolonging driving mode, the amount of the signal processing of the semiconductor device 100 is smaller than that in the normal driving mode, for example, the functions are partly stopped, and the operation speed of the semiconductor device 100 is decreased. In the life-prolonging driving mode, however, the operation of the semiconductor device 100 can continue, and the remaining lifetime can be increased to a lifetime longer than that in the case where the normal driving mode continues in a manner in which a load that is applied to the circuit of the semiconductor device 100 is decreased to a level lower than that in the normal driving mode.

In some cases, the throughput of the signal processing of the semiconductor device 100 in the life-prolonging driving mode is less than that in the normal driving mode. For example, it can be said that the throughput of the signal processing corresponds to the quantity of signals on which the semiconductor device 100 performs the signal processing per unit time. In this example, one or a plurality of the amount of electric current supply from an electric current source, the drive voltage (power supply voltage), and the operating frequency of the semiconductor device 100 in the life-prolonging driving mode is less than in the normal driving mode. In another example, in the normal driving mode, the signal processing is performed for a first period. The life-prolonging driving mode comprises an intermittent drive in which the signal processing is performed for a second period shorter than the first period and signal processing is not performed for a period that is included in the first period and that is not included in the second period, or a drive for reducing the throughput of the signal processing to a level lower than that in the second period. In an example in FIG. 3C, the remaining lifetime of the semiconductor device 100 that operates in the life-prolonging driving mode is longer than the second lifetime threshold L2, and subsequent operation in the normal driving mode is possible.

At S207, the lifetime estimating unit 109 calculates the remaining lifetime Lj of the semiconductor device 100 at time j.

At S208, the driving mode selecting unit 105 compares the second lifetime threshold L2 and the remaining lifetime Lj at time j. If Lj>L2 is satisfied, the processing proceeds to S209. If Lj≤L2 is satisfied, the processing proceeds to S210. FIG. 3C illustrates the case where Lj>L2 is satisfied.

In the state of Lj>L2, the remaining lifetime of the semiconductor device 100 that operates in the life-prolonging driving mode is shorter than the first lifetime threshold L1 and is longer than the second lifetime threshold L2. Accordingly, the semiconductor device 100 has an enough remaining lifetime in the life-prolonging driving mode relative to a predetermined operation continuation period. Accordingly, even when the operation continues for a period not in the life-prolonging driving mode but in the normal driving mode, the semiconductor device 100 can continue the operation until the predetermined operation continuation period. Accordingly, the driving state of the semiconductor device 100 is restored to the normal driving mode before the mode is changed into the life-prolonging driving mode. The processing proceeds to S203, and the operation of the semiconductor device 100 continues in the normal driving mode for a freely determined period Δt1. Subsequently, the processing returns to S201.

An example in FIG. 3D will now be described.

Figure 3D:
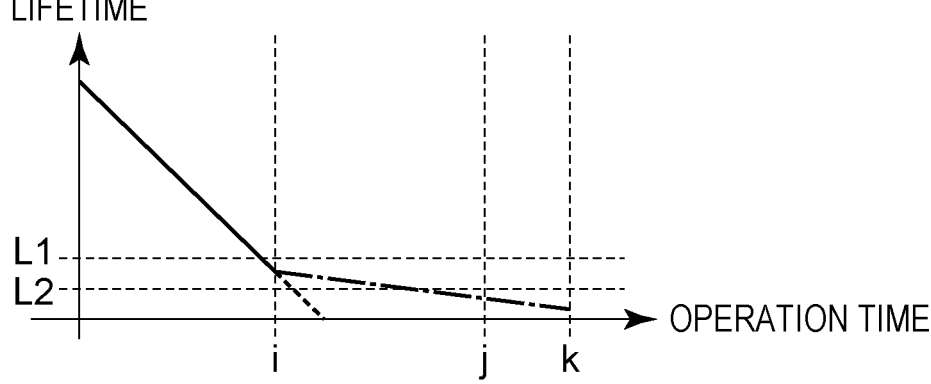
FIG. 3D illustrates a relationship between the operation time and the lifetime of the semiconductor apparatus.

In FIG. 3D, a dashed line represents an estimated remaining lifetime of the semiconductor device 100 that is estimated by the lifetime estimating unit 109 at time i with respect to the operation time of the semiconductor device 100. A one-dot chain line represents a relationship between the operation time of the semiconductor device 100 and the remaining lifetime of the semiconductor device 100 in a changed driving state after the driving state of the semiconductor device 100 is changed at time i.

At S208, the driving mode selecting unit 105 compares the second lifetime threshold L2 and the remaining lifetime Lj at time j. FIG. 3D illustrates the case where Li≤L2 is satisfied.

At S210, the lifetime estimating unit 109 calculates the remaining lifetime Lk of the semiconductor device 100 at time k.

At S211, the driving mode selecting unit 105 determines whether the remaining lifetime Lk at time k is more than 0. If Lk>0 is satisfied, the processing proceeds to S212. If Lk≤0 is satisfied, the processing proceeds to S213. According to the present embodiment, the case where the processing proceeds to S212 when Lk>0 is satisfied will be described.

In the state of Lk>0, the remaining lifetime of the semiconductor device 100 that operates in the life-prolonging driving mode is shorter than the first lifetime threshold L2. The remaining lifetime of the semiconductor device 100 is close to 0 but is more than 0. Accordingly, the processing proceeds to S212, and a process of continuing the operation of the semiconductor device 100 for a freely determined period Δt2 is performed. The processing returns to S210. At this time, since the remaining lifetime of the semiconductor device 100 is shorter than the second lifetime threshold L2, the period Δt2 that corresponds to an interval in which the remaining lifetime Lk is obtained is set shorter than the period Δt1 that corresponds to an interval in which the remaining lifetime Li is obtained in the case where the remaining lifetime is longer than the first lifetime threshold L1. This enables a time during which a normal operation of the semiconductor device 100 is not guaranteed to be detected with precision.

An example in FIG. 3E will now be described.

Figure 3E:
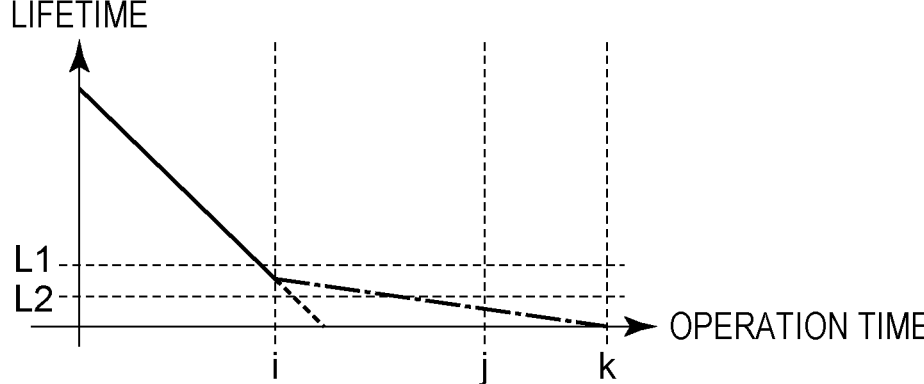
FIG. 3E illustrates a relationship between the operation time and the lifetime of the semiconductor apparatus.

FIG. 3E illustrates the case where Lk≤0 is satisfied.

In the state of Lk≤0, the remaining lifetime Lk of the semiconductor device 100 is equal to or less than 0, and the operation is not guaranteed. The processing proceeds to S213, and it is reported to the outside that the operation of the semiconductor device 100 is not guaranteed. An example of a reporting method is to notify the user of the semiconductor device 100 by using, for example, a display not illustrated in FIG. 1. In another example, the report is made to a monitoring system that monitors the semiconductor device 100 via a communication line. Subsequently, the processing proceeds to S214, and the operation of the semiconductor device 100 is stopped.

In the case in FIG. 3E, the remaining lifetime of the semiconductor device 100 is equal to or less than 0 at time k, and the operation of the semiconductor device 100 is not guaranteed. For this reason, it is reported to a location outside the semiconductor device 100 that the operation of the semiconductor device 100 is not guaranteed. The operation of the semiconductor device 100 is stopped.

Accordingly, the operation is prevented from continuing while the operation is not guaranteed even though the remaining lifetime of the semiconductor device 100 is equal to or less than 0.

In this way, the semiconductor apparatus according to the present embodiment changes the driving state, based on the remaining lifetime information. This enable the semiconductor device 100 to be driven depending on the remaining lifetime. In the case where the remaining lifetime of the semiconductor device 100 is less than the first lifetime threshold, the mode is changed from the normal driving mode into the life-prolonging driving mode. This enables the lifetime of the semiconductor device 100 to be prolonged while the operation of the semiconductor device 100 continues. In the case where the remaining lifetime of the semiconductor device 100 is less than the second lifetime threshold, the interval in which the remaining lifetime information is obtained is shortened to a level lower than that in the case where the remaining lifetime is more than the first lifetime threshold. This enables the remaining lifetime of the semiconductor device 100 to be obtained with precision. In the case where the remaining lifetime of the semiconductor device 100 is equal to or less than 0, this is reported to a location outside the semiconductor device 100. This prevents the operation from continuing while the operation of the semiconductor device 100 is not guaranteed.

According to the present embodiment, the driving mode of the semiconductor device 100 is changed depending on whether the remaining lifetime exceeds the first lifetime threshold. This example is not a limitation. In the case where the remaining lifetime corresponds to the first length, the mode may be changed into the normal driving mode. In the case where the remaining lifetime corresponds to the second length shorter than the first length, the mode may be changed into the life-prolonging driving mode.

In an example described according to the present embodiment, the semiconductor apparatus includes the lifetime estimating unit 109 but is not limited to this example. According to an embodiment, the semiconductor apparatus may include a time obtaining unit that obtains time information that represents the elapsed time of the operation of the semiconductor device 100. In this case and in the case where the time information corresponds to the first length, the semiconductor device 100 is driven in the first condition. In the case where the time information corresponds to the second length longer than the first length, the semiconductor device 100 is driven in the second condition. In the second condition, the throughput of the signal processing is less than that in the case where the semiconductor device is driven in the first condition, and the remaining lifetime of the semiconductor device is longer than that in the case where the semiconductor device is driven in the first condition.

Second Embodiment

In the description according to the present embodiment, an image sensor is used as the semiconductor device 100 according to the first embodiment.

Figure 4:
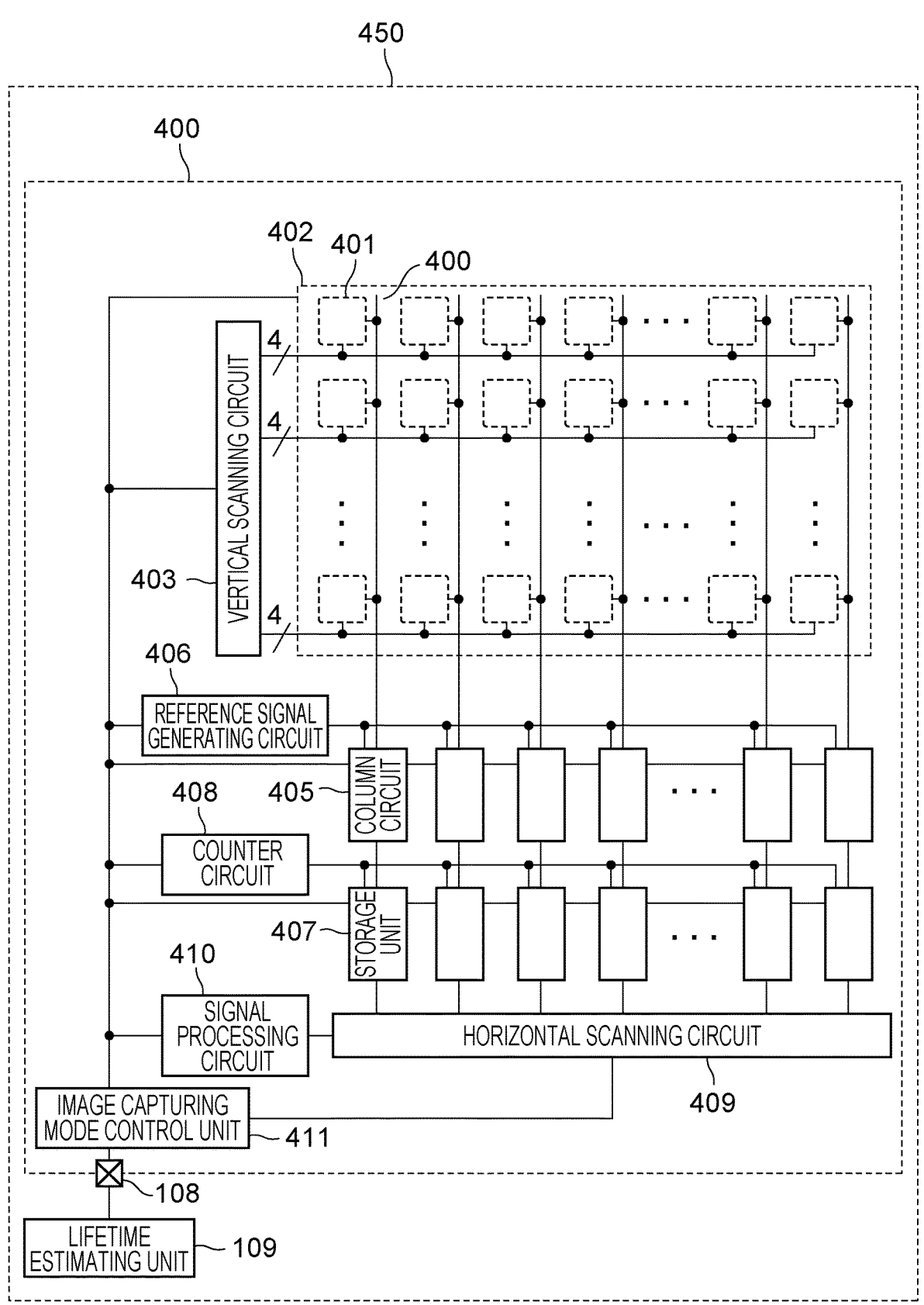
FIG. 4 illustrates the structure of an image capturing apparatus.

An image capturing apparatus 450 illustrated in FIG. 4 includes the image sensor and the lifetime estimating unit 109. An image sensor 400 is a CMOS sensor. A pixel array 402 that includes pixels 401 that are arranged in rows and in columns, a vertical scanning circuit 403, vertical output lines 404, and column circuits 405 is provided. The image sensor 400 includes a reference signal generating circuit 406, storage units 407, a counter circuit 408, a horizontal scanning circuit 409, a signal processing circuit 410, an image capturing mode control unit 411, and the lifetime estimating unit 109.

Figure 5:
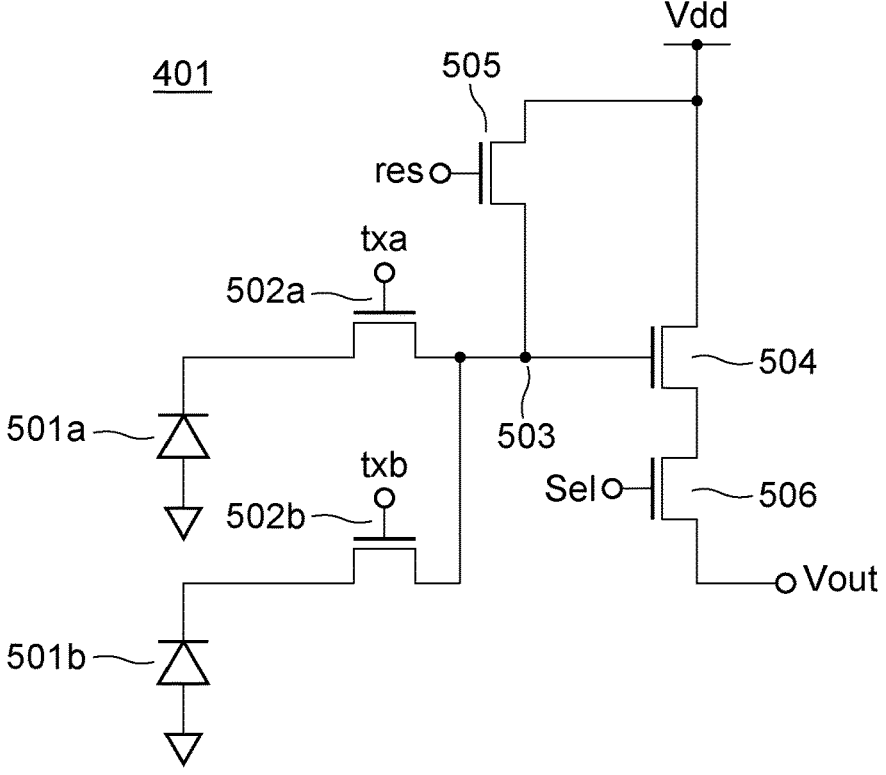
FIG. 5 is an equivalent circuit diagram of a pixel.

The structure of each pixel 401 will now be described with reference to FIG. 5.

Each pixel 401 includes photodiodes 501a and 501b. On the photodiodes 501a and 501b of the single pixel 401, light that passes through a single microlens, not illustrated, is incident. In other words, the photodiodes 501a and 501b receive light from different regions of an exit pupil of an optical system that guides the light to the CMOS sensor. For this reason, the use of a signal based on electric charges that are obtained by photoelectric conversion carried out by the photodiodes 501a and 501b enables focus detection in a phase difference method.

An image can be generated by using a signal corresponding to an electric charge that is obtained by adding the electric charge that is obtained by the photoelectric conversion carried out by the photodiode 501a and the electric charge that is obtained by the photoelectric conversion carried out by the photodiode 501b.

The photodiodes 501a and 501b accumulate the electric charges depending on the incident light.

The vertical scanning circuit 403 illustrated in FIG. 4 performs vertical scanning in which signals are read in a unit of the rows from the pixels 401 that are arranged in the rows. The electric charge that is accumulated by the photodiode 501a is transferred to a floating diffusion unit (FD unit) 503 by setting a signal txa that is outputted to a transfer gate 502a at a high level.

The electric charge that is accumulated by the photodiode 501b is transferred to the FD unit 503 in a manner in which the vertical scanning circuit 403 sets a signal txb that is outputted to a transfer gate 502b at a high level.

The FD unit 503 converts the electric charges that are transferred from the photodiodes 501a and 501b into a voltage, based on the capacity of the FD unit 503. The FD unit 503 is connected to a gate of an amplifier transistor 504. The amplifier transistor 504 is connected to the vertical output line 404 via a selection transistor 506.

Each pixel 401 includes a reset transistor 505 that is connected to the FD unit 503. The reset transistor 505 resets the FD unit 503 in a manner in which the vertical scanning circuit 403 sets a signal res at a high level. In the case where the electric charges of the photodiodes 501a and 501b are reset by photodiode resetting, the vertical scanning circuit sets the signals txa and txb at a high level in the period in which the signal res is at a high level.

The signals res, txa, txb, and sel that are supplied from the vertical scanning circuit 403 are inputted into the pixels 401 in a single row in common. The outputs vout of the pixels 401 are inputted into the corresponding column circuits 405 via the vertical output lines 404 corresponding to the columns in which the pixels 401 are arranged.

The structure of each column circuit 405 that is arranged for every column will now be described with reference to FIG. 6.

Figure 6:
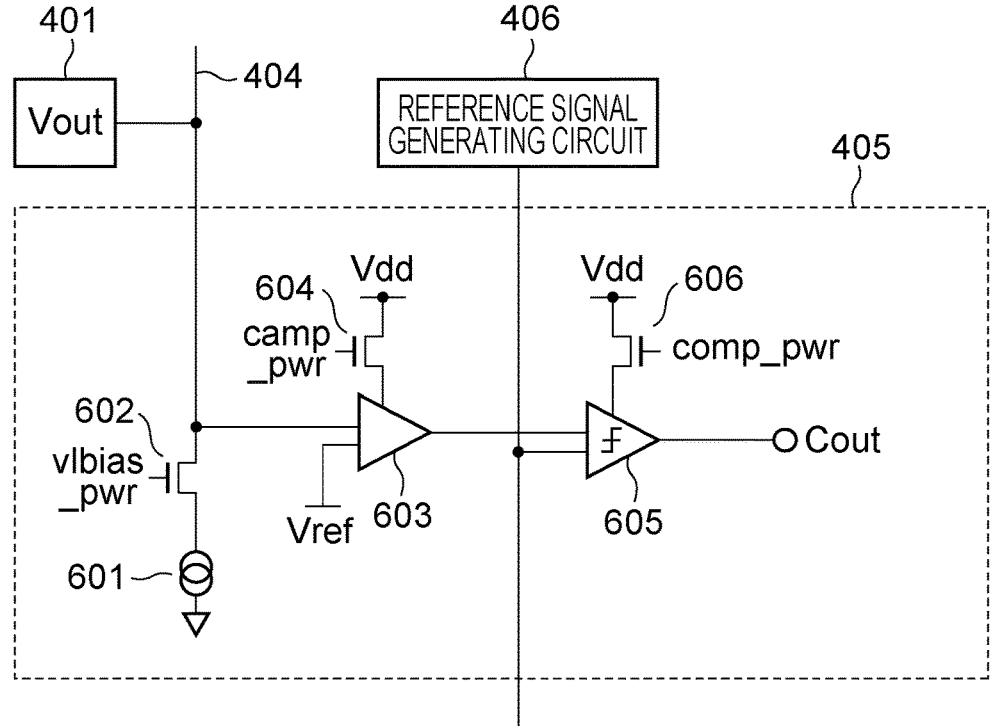
FIG. 6 a block diagram of a column circuit.

FIG. 6 illustrates the structure of each column circuit 405. The column circuit 405 includes an electric current source 601, a switch 602, a differential amplifier 603, a switch 604, a comparator 605, and a switch 606.

The switch 602 switches between on and off of the electric current source 601. The switch 604 switches between on and off of the differential amplifier 603. The switch 606 switches between on and off of the comparator 605.

When the switch 602 is on, the vertical scanning circuit 403 sets a signal sel that is supplied to the pixel 401 in the row to be read at a high level. Consequently, an electric current flows between the amplifier transistor 504 and the electric current source 601 via the selection transistor 506 of the pixel 401 in the row to be read. Consequently, the amplifier transistor 504 performs a source follower operation. Consequently, a signal (pixel signal) based on the voltage of the FD unit 503 is outputted to the vertical output line 404.

When the switch 604 is on, the differential amplifier 603 operates. In this case, the differential amplifier 603 outputs, to the comparator 605, an amplified signal that is obtained by amplifying the pixel signal that is outputted from the pixel 401 to the vertical output line 404.

When the switch 606 is on, the comparator 605 operates. In this case, the comparator 605 compares the voltage of the amplifier signal that is outputted from the differential amplifier 603 and the voltage of a ramp signal that is supplied from the reference signal generating circuit 406. The comparator 605 outputs, as a signal Cout, the result of comparison to each storage unit 407 illustrated in FIG. 4. The signal level of the signal Cout changes when a relationship in the magnitude of the signal voltage is inverted. A count signal is inputted into the storage unit 407 from the counter circuit 408. The count signal changes a count value in response to a timing with which the voltage of the ramp signal that is supplied from the reference signal generating circuit 406 starts changing. The storage unit 407 latches the count value, based on a timing with which the signal level of the signal Cout changes. This enables the storage unit 407 to obtain digital data corresponding to the signal level of the amplifier signal. In this way, the column circuit 405 and the storage unit 407 carry out AD conversion of the pixel signal.

The digital data that is stored in the storage unit 407 is sequentially transferred to the signal processing circuit 410 by using the horizontal scanning circuit 409 for every column. A series of operations in relation to readout of the pixel signals from the pixels are performed while a pixel row of the pixel array 402 is selected by the vertical scanning circuit 403.

Figure 7A:
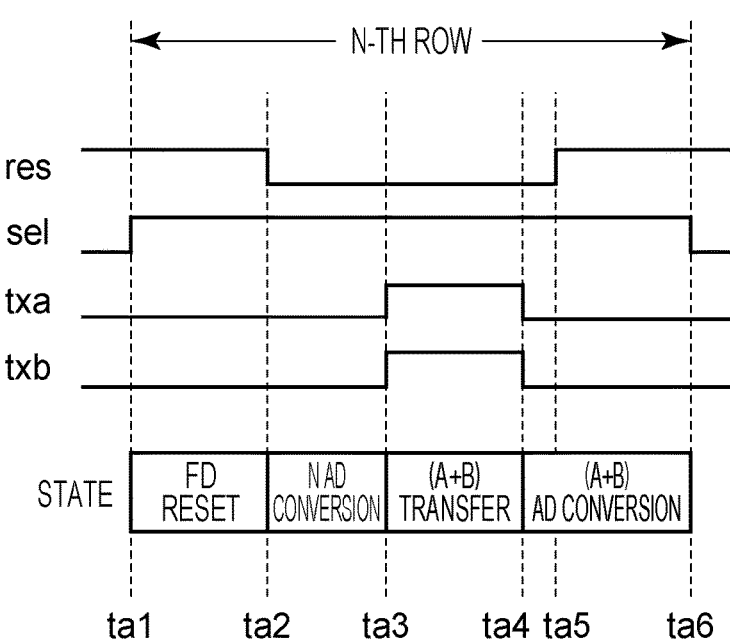
FIG. 7A illustrates the operation of the image capturing apparatus.
Figure 7B:
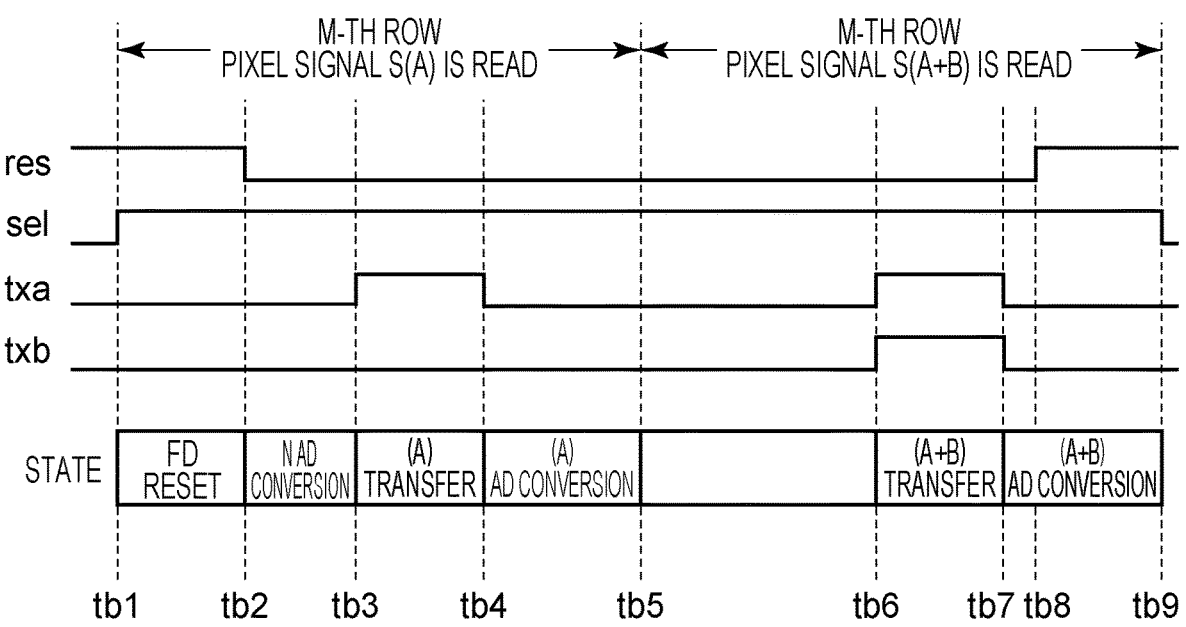
FIG. 7B illustrates the operation of the image capturing apparatus.

FIGS. 7A and 7B are timing diagrams illustrating the operation of the image capturing apparatus illustrated in FIG. 6. FIG. 7A is a timing diagram in the case where an image capturing operation is performed. FIG. 7B is a timing diagram in the case where a focus detection operation and the image capturing operation are performed. The pixel signals are read out from pixels 401 included in a part of the rows among the pixels 401 in the rows that are arranged in the pixel array 402 by performing the image capturing operation and the focus detection operation illustrated in FIG. 7B. The pixel signals are read out from pixels 401 included in another part of the rows by performing the image capturing operation illustrated in FIG. 7A. The part of the rows and the other part of the rows are assigned depending on a region in which the focus detection is made. In another example, the pixels 401 in all of the rows perform the operation in FIG. 7A for a certain frame. The operation in FIG. 7B may be performed for another frame. The frame described in this case may correspond to, for example, a period from when the vertical scanning circuit 403 starts vertical scanning until when the next vertical scanning is started. The frame can typically correspond to a period in which a control circuit, not illustrated, sets the signal level of a vertical synchronization signal for instructing the start of vertical scanning of the vertical scanning circuit 403 at a high level and subsequently sets the signal level of a vertical synchronization signal at a high level. In another example, the frame can also correspond to a period from the starts of reading a signal corresponding to one image that is generated by a signal processing unit from the pixel array 402 to the starts of reading a signal corresponding to the next one image from the pixel array 402. For example, it is assumed that a video is shot at 60 fps (fps is an abbreviation for frames per second). In this example, the frame can correspond to a period in which a signal corresponding to an image of one frame of 60 frames starts to be read out from the pixel array 402, and a signal corresponding to an image of a next one frame subsequently starts to be read out from the pixel array 402.

The operation in FIG. 7A will now be described.

At time ta1, the vertical scanning circuit 403 sets the signal sel that is supplied to the row of the pixel 401 that performs the image capturing operation at a high level. Consequently, the selection transistor 506 of the pixel 401 is turned on.

Subsequently, at time ta2, the vertical scanning circuit 403 sets the signal res at a low level and turns the reset transistor 505 off. Consequently, the reset of the FD unit 503 is released.

The amplifier transistor 504 outputs a noise signal (N signal) based on the voltage of the FD unit 503 the reset of which is released to the vertical output line 404 via the selection transistor 506. The N signal that is outputted to the vertical output line 404 is converted into digital data (N data) by AD conversion carried out by the column circuit 405 and the storage unit 407.

At time ta3, the vertical scanning circuit 403 sets the signals txa and txb at a high level and subsequently sets the signals txa and txb at a low level. As a result of this operation, the electric charge that is accumulated based on the incident light by the photodiode 501a and the electric charge that is accumulated based on the incident light by the photodiode 501b are transferred to the FD unit 503. Accordingly, the voltage of the FD unit 503 corresponds to the electric charge that is obtained by adding the electric charge of the photodiode 501a and the electric charge of the photodiode 501b.

The amplifier transistor 504 outputs a signal based on the voltage of the FD unit 503 that corresponds to the electric charge that is obtained by adding the electric charge of the photodiode 501a and the electric charge of the photodiode 501b, to the vertical output line 404 via the selection transistor 506. The signal that is outputted by the amplifier transistor 504 will be described. If the voltage of the FD unit 503 is based on the electric charge that is accumulated based on the incident light by the photodiode 501a, the signal that is outputted by the amplifier transistor 504 is referred to as an A+N signal (the sum of an A signal and the N signal). If the voltage of the FD unit 503 is based on the electric charge that is accumulated based on the incident light by the photodiode 501b, the signal that is outputted by the amplifier transistor 504 is referred to as a B+N signal (the sum of a B signal and the N signal). In these cases, the signal that is outputted by the amplifier transistor 504 and that is based on the voltage of the FD unit 503 that corresponds to the electric charge that is obtained by adding the electric charge of the photodiode 501a and the electric charge of the photodiode 501b corresponds to a signal that is obtained by adding the A+N signal and the B+N signal. Accordingly, the signal that is outputted by the amplifier transistor 504 is referred to as an A+B+N signal. The A+B+N signal that is outputted to the vertical output line 404 is converted into digital data (A+B+N data) by AD conversion carried out by the column circuit 405 and the storage unit 407.

At time ta5, the vertical scanning circuit 403 sets the signal res at a high level. Consequently, the voltage of the FD unit 503 is reset.

At time ta6, the vertical scanning circuit 403 sets the signal sel at a low level. This is the end of the selection of the pixels 401 in one row. Subsequently, the vertical scanning circuit 403 sets the signal sel of the pixels 401 in the rows for next to be read at a high level.

The N data and the A+B+N data that are held by the storage unit 407 are sequentially read out from the storage unit 407 into the signal processing circuit 410 by using the horizontal scanning circuit 409 for every column. The signal processing circuit 410 outputs A+B data that corresponds to a signal of a difference between the A+B+N data and the N data.

The operation in FIG. 7B will now be described.

An operation at time tb1 is the same as an operation at time ta1 in FIG. 7A.

An operation at time tb2 is the same as an operation at time ta2 in FIG. 7A.

At time tb3, the vertical scanning circuit 403 sets the signal txa at a high level and subsequently sets the signal txa at a low level. Consequently, the electric charge that is accumulated based on the incident light by the photodiode 501a is transferred to the FD unit 503. The amplifier transistor 504 outputs the A+N signal to the vertical output line 404 via the selection transistor 506. The A+N signal that is outputted to the vertical output line 404 is converted into digital data (A+N data) by AD conversion carried out by the column circuit 405 and the storage unit 407.

The FD unit 503 holds the electric charge that is transferred from the photodiode 501a until before time tb6.

At time tb6, the vertical scanning circuit 403 sets the signal txa and the signal txb at a high level and subsequently sets the signal txa and the signal txb at a low level. Consequently, the FD unit 503 holds the electric charge that is accumulated based on the incident light by the photodiode 501b and the electric charge that is accumulated in a period from time tb4 to time tb7 by the photodiode 501a in addition to the electric charge of the photodiode 501a that is held before time tb6. Accordingly, the voltage of the FD unit 503 corresponds to the electric charge that is obtained by adding the electric charge of the photodiode 501a and the electric charge of the photodiode 501b.

The amplifier transistor 504 outputs the A+B+N signal to the vertical output line 404. The A+B+N signal that is outputted to the vertical output line 404 is converted into digital data (A+B+N data) by AD conversion carried out by the column circuit 405 and the storage unit 407.

At time tb8, the vertical scanning circuit 403 sets the signal res at a high level. Consequently, the voltage of the FD unit 503 is reset.

At time tb9, the vertical scanning circuit 403 sets the signal sel at a low level. This is the end of the selection of the pixels 401 in one row. Subsequently, the vertical scanning circuit 403 sets the signal sel of the pixel 401 in the row for next to be read at a high level.

The N data, the A+N data, and the A+B+N data that are held by the storage unit 407 are sequentially read out from the storage unit 407 into the signal processing circuit 410 by using the horizontal scanning circuit 409 for every column. The signal processing circuit 410 outputs a signal (A data)

of a difference between the A+N data and the N data and a signal of a difference between the A+B+n data and the N data (A+B data).

The signal processing unit, not illustrated, which receives the data that is outputted by the image capturing apparatus obtains B data that corresponds to a difference between the A data and the A+B data and performs the focus detection by using the A data and the B data. The signal processing unit generates an image by using the A+B data.

FIG. 4 is referred. The image capturing mode control unit 411 is a circuit block that includes the voltage control unit 104, the driving mode selecting unit 105, the frequency control unit 106, and the signal generating unit 107 described according to the first embodiment. The image capturing mode control unit 411 receives the remaining lifetime information from the lifetime information receiving unit 108. The voltage values that are supplied to all or a part of the circuits in the image sensor 400 or the period of the control signal are changed depending on the remaining lifetime that represents the remaining lifetime information. The circuits in the image sensor 400 are the pixel array 402, the vertical scanning circuit 403, the column circuits 405, the reference signal generating circuit 406, the storage units 407, the counter circuit 408, the horizontal scanning circuit 409, and the signal processing circuit 410. Alternatively, the operation of a part of the pixel array 402, the vertical scanning circuit 403, the column circuits 405, the reference signal generating circuit 406, the storage units 407, the counter circuit 408, the horizontal scanning circuit 409, and the signal processing circuit 410 in the image sensor 400 is stopped.

As defined as expression (1) to expression (4) according to the first embodiment, the lifetime of the semiconductor apparatus is limited by the current density J of the wiring line, the temperature T of the wiring line, the voltage Vg that is applied to the gate of the transistor, and the maximum substrate current Isub that flows through the semiconductor substrate. The image capturing mode control unit 411 changes the state of the operation such that all or a part of the current density J, the temperature T of the wiring line, the voltage Vg that is applied to the gate of the transistor, and the maximum substrate current Isub that flows through the semiconductor substrate decrease in order to prolong the remaining lifetime of the image sensor 400.

Consequently, the throughput of the signal processing of the image capturing apparatus is reduced, for example, the speed of the operation is decreased or the functions are partly stopped. However, while the image capturing operation continues, the lifetime of the image capturing apparatus can be increased.

In the life-prolonging driving mode of the image capturing mode control unit 411, the frame rate, for example, decreases. Specifically, the period of the vertical scanning of the vertical scanning circuit 403 decreases relative to the normal driving mode. The decrease in the period of the vertical scanning results in decreases in the operation periods of the reference signal generating circuit 406, the counter circuit 408, the horizontal scanning circuit 409, and the signal processing circuit 410. It can also be said that a decrease in the frame rate means a decrease in the number of times the vertical scanning circuit 403 performs the vertical scanning per unit time.

In an example of the life-prolonging driving mode, signals may be read out from the pixels 401 in a region of a part of the pixel array 402. That is, the number of the pixels that are read out in the life-prolonging driving mode is smaller than that in the normal driving mode. For example, the pixels 401 suitable for a resolution of 4K2K are read in the normal driving mode, and the pixels 401 suitable for a resolution of VGA are read in the life-prolonging driving mode. Because of the decrease in the number of the pixels 401 that are read, in the column circuits 405 and the storage units 407, the horizontal scanning circuit 409 scans the storage units 407 in a part of the columns. Consequently, while the operation of the image capturing apparatus continues, the remaining lifetime of the image capturing apparatus can be prolonged. This example is one of the examples in which the throughput of the signal processing of the image capturing apparatus is reduced.

In another example, the number of the pixels that perform the focus detection operation in FIG. 7B in the life-prolonging driving mode may be less than that in the normal driving mode. Consequently, the number of times that the AD conversion of the A+N signal is carried out by the column circuits 405 and the storage units 407 can be decreased. Consequently, while the image capturing operation continues, the remaining lifetime of the image capturing apparatus can be prolonged. In particular, in the case where an extension in the remaining lifetime is considered to be important, no pixels perform the focus detection operation in FIG. 7B, and all of the pixels 401 carries out drive of the image capturing operation in FIG. 7A. This example is one of the examples in which the throughput of the signal processing of the image capturing apparatus is reduced.

The lifetime estimating unit 109 obtains the remaining lifetime information on the image sensor 400 by estimating the remaining lifetime of the image sensor 400, based on the latest state of the operation of the image sensor 400 or the history information in relation to the state of the operation as described according to the first embodiment.

The state of the operation means a state in which image sensor 400 operates such as an operation voltage or an operating frequency at which the image sensor 400 operates or a state caused as a result of the operation such as a temperature.

The lifetime estimating unit 109 obtains the remaining lifetime information after the image capturing operation is performed multiple times. The image capturing operation described herein means an operation for imaging an object in various environments. That is, the image capturing operation does not mean the image capturing operation of the image sensor 400 in a known environment such as a test in a manufacturing factory of an image capturing apparatus but means an image capturing operation in an environment in which the remaining lifetime of the image sensor 400 changes due to the environment in which the image sensor 400 is disposed. Accordingly, the image capturing apparatus according to the present embodiment can estimate the remaining lifetime depending on a previous environment or a current environment in which the image sensor 400 is actually disposed and the operation. Since the remaining lifetime is estimated based on the previous environment or the current environment in which the image sensor 400 is actually disposed, the remaining lifetime can be estimated more accurately than the lifetime is estimated in a simulation.

According to the embodiment of the present invention described above, as for the image sensor 400, drive for prolonging the lifetime of the image sensor 400 is selected based on the remaining lifetime information. This solves a problem in that the image sensor 400 spends the lifetime earlier than a service life.

The image capturing apparatus according to the present embodiment can be used, for example, as a camera that is disposed in an area in which it is difficult to replace the image capturing apparatus. Examples of the camera include cameras (disaster monitoring (a volcanic disaster and a meteorological disaster) that are disposed in remote areas and monitoring cameras that are disposed in a space ship, an artificial satellite (such as a weather observation satellite, an exploration satellite, or a space station), and a space exploration robot), and monitoring cameras that are disposed in conflict areas. As for these cameras, the image capturing apparatus is not easy to replace even after the lifetime, and it is desired that the operation of the image capturing apparatus continues. Accordingly, in the case where the estimated remaining lifetime is shorter than the first lifetime threshold, the operation of the image sensor 400 is changed from that in the normal driving mode to that in the life-prolonging driving mode. Consequently, while the image capturing operation continues, the remaining lifetime of the operation of the image capturing apparatus can be prolonged.

The image capturing apparatus according to the present embodiment can be used as a vehicle-mounted camera that is taken as an example of the image capturing apparatus that is mounted on a moving object. As for the vehicle-mounted camera, the image sensor 400 is not easy to replace during driving even when the remaining lifetime is shorter than the first lifetime threshold. In this case, it is useful that the normal driving mode is changed into the life-prolonging driving mode, the image capturing operation of the image sensor 400 continues, and the lifetime of the image sensor 400 is increased.

The lifetime estimating unit 109 obtains the remaining lifetime information in parallel with the image capturing operation. For example, in the case of a camera that is disposed in a remote area or a camera that continuously shoots a video such as a monitoring camera, the lifetime estimating unit 109 obtains the remaining lifetime information in a period in which the image capturing operation is performed. Consequently, while the video is continuously shot, the remaining lifetime of the image sensor 400 can be estimated. In other words, the lifetime estimating unit 109 may obtain the remaining lifetime information in a period in which vertical scanning is performed. The lifetime estimating unit 109 may obtain the remaining lifetime information in a period in which the photoelectric converters accumulate electric charges based on the incident light. The lifetime estimating unit 109 may obtain the remaining lifetime information in a period (for example, a period in which AD conversion is carried out) in which the column circuits 405 and the storage units 407 process the pixel signals. That is, after the image capturing operation is performed multiple times, the lifetime estimating unit 109 may obtain the remaining lifetime information in parallel with the period in which the image capturing operation is performed.

Thus, even in the case where the image sensor is not easy to replace, the image capturing apparatus according to the present embodiment enables the lifetime of the image sensor to be prolonged while continuing the operation of the image sensor.

Third Embodiment

An image capturing apparatus according to the present embodiment, mainly differences from the second embodiment will be described. The image capturing apparatus according to the present embodiment can obtain the remaining lifetime information on the image sensor with precision.

Figure 8:
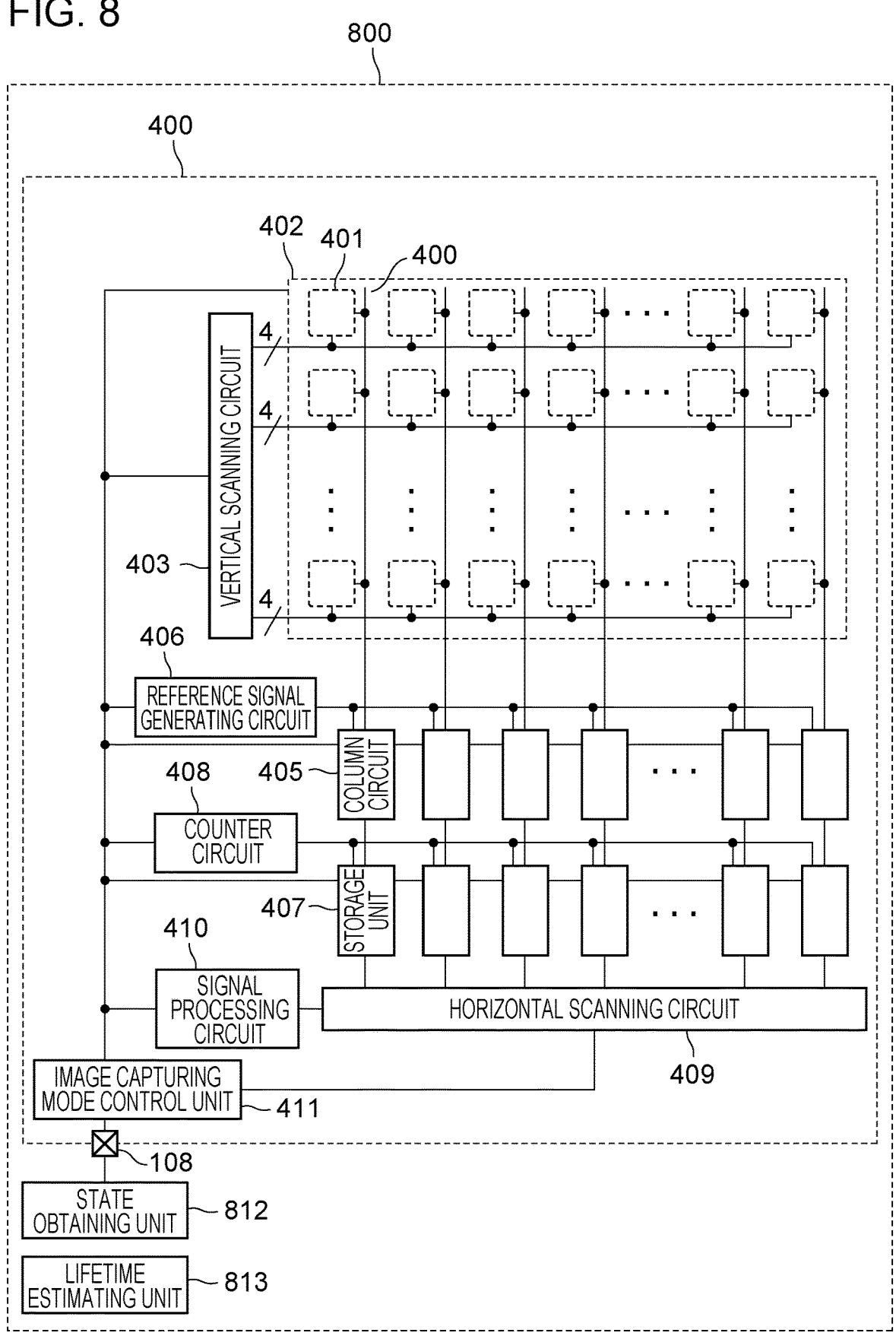
FIG. 8 illustrates the structure of an image capturing apparatus.

FIG. 8 illustrates an image capturing apparatus 800 according to the present embodiment.

The image capturing apparatus 800 according to the present embodiment differs from the image capturing apparatus 450 illustrated in FIG. 4 in including a state obtaining unit 812 and a lifetime estimating unit 813 that is connected to the state obtaining unit 812.

The following description includes the case where hot carrier injection (HC) is dominant regarding a factor in the impairment in the performance of the image sensor 400. In this case, the remaining lifetime of the image sensor 400 is evaluated by using a ratio of a variation ΔId in a drain current over time with respect to a drain current Id of the transistor when the image sensor 400 starts operating as a new product, that is, the following expression (5):

$$IdRATIO = \Delta Id/Id. \quad (5)$$

The state obtaining unit 812 measures the drain current Id of the transistor of the image sensor 400. The result of measurement is outputted to the lifetime estimating unit 813. The lifetime estimating unit 813 calculates a ratio of a variation in the latest drain current Id of a MOS transistor to the known initial drain current Id of the MOS transistor.

It is assumed that the lifetime of the image sensor 400 is set to a time at which the IdRATIO in expression (5) becomes 0.1, that is, 10%. In this case, the lifetime estimating unit 813 sets a threshold for the IdRATIO to 10%. The lifetime estimating unit 813 estimates the remaining lifetime of the image sensor 400 by comparing a threshold of 10% and the actual IdRATIO.

In an example of a method of measuring the drain current Id of the transistor, a resistance element is disposed in the state obtaining unit 812, an end of the resistance element is connected to the power supply voltage, and the other end of the resistance element is connected to the drain of the transistor of the image sensor 400. A voltage value across both terminals of the resistance element is measured. Consequently, the drain current can be measured by using the expression of V=IR (V is the voltage across both terminals of the resistance element, R is the resistance value of the resistance element, and I is the value of an electric current that flows through the resistance element). The period until the IdRATIO becomes 10%, that is, the remaining lifetime can be estimated by obtaining a variation in the IdRATIO over time.

In another method of obtaining the remaining lifetime information, a variation in electric power consumption of the image sensor 400 may be measured. The drain current Id of the transistor can be indirectly measured by measuring a variation between the electric power consumption at measurement and the electric power consumption of the image sensor 400 when the image sensor is a new product. The remaining lifetime can be estimated by obtaining a variation in the electric power consumption over time.

Fourth Embodiment

An image capturing apparatus according to the present embodiment, mainly differences from the third embodiment will be described. The structure of the image capturing apparatus can be the same as that in FIG. 8.

The image capturing apparatus according to the third embodiment estimates the remaining lifetime by using the variation in the drain current Id. According to the present embodiment, another estimating method will be described.

The performance of the semiconductor device and the image sensor impairs due to the HC, the EM, the TDDB, or the negative NBTI as described according to the first embodiment. The lifetimes of the semiconductor device and the image sensor are determined by the impairment in the performance.

Lifetime estimation in relation to the impairment in the performance due to the HC is described according to the third embodiment.

A lifetime LT (EM) when the factor in the impairment in the performance is the EM is obtained by using expression (1) described according to the first embodiment.

A lifetime LT (TDDB) when the factor in the impairment in the performance is the TDDB is obtained by using expression (2) according to the first embodiment.

A lifetime LT (NBTI) when the factor in the impairment in the performance is the NBTI can be calculated by using expression (4) described according to the first embodiment.

A lifetime LT (HC) when the factor in the impairment in the performance is the HC is obtained by using expression (3) described according to the first embodiment and is also obtained by using expression (5) described according to the third embodiment.

The state obtaining unit 812 performs measurement of all or a part of expression (1) to expression (5) and calculates the lifetime of the image sensor 400.

To calculate the lifetime of the image sensor 400 by using expression (1) to expression (5), the state obtaining unit 812 measures the current density J of the electric current that flows through the transistor or the resistance element that is included in the image sensor 400, the temperature T of the wiring line, and the voltage value Vg that is applied to the gate of the transistor.

A method of obtaining the current density J is the same as that according to the third embodiment.

In an example of a method of obtaining the temperature T of the wiring line, the value of an electric current that flows through a diode element, not illustrated, of the state obtaining unit 812 is measured. The value of the electric current that flows through the diode element typically depends on the temperature. Accordingly, the temperature T can be obtained by measuring the value of the electric current.

The voltage value Vg can be a gate voltage that is applied to the transistor the lifetime of which is to be estimated. In the case where it can be expected that a difference between a measured value and a design value can be substantially ignored, the voltage value Vg may be the designed value.

The state obtaining unit 812 thus obtains the values that are used in expression (1) to expression (5). The state obtaining unit 812 outputs the obtained values to the lifetime estimating unit 813. That is, the state obtaining unit 812 obtains the electric current consumption and the temperature of the image sensor 400. The state obtaining unit 812 may further obtain information about the frame rate and the cumulative time of the operation of the image sensor 400.

The lifetime estimating unit 813 obtains the lifetime of the image sensor 400 by using all or a part of expression (1) to expression (5). In the case where the lifetime is estimated by using multiple expressions among expression (1) to expression (5), the lifetime estimating unit 813 sets the lifetime of the image sensor 400 to the minimum lifetime among those obtained by the used expressions.

The lifetime estimating unit 813 according to the present embodiment thus estimates a lifetime based on the actual state of the operation of the image sensor 400. Consequently, the lifetime can be estimated with precision.

The lifetime of the image sensor 400 greatly varies depending on an usage environment. The lifetime varies depending on the temperature at which the image sensor 400 is disposed, the number of times of shooting, and an supplied voltage. For example, a time during which the vehicle-mounted camera is left at a high temperature of 80° C. or more in a low latitude area is longer than that in a high latitude area. A time during which the vehicle-mounted camera is left at a low temperature of 0° C. or less in the high latitude area is longer than that in the low latitude area. Accordingly, the actual lifetime of the image sensor 400 can be shorter than a designed lifetime. Consequently, lifetime estimation based on the actual operation of the image sensor 400 enables the operation of the image sensor 400 to be unlikely to stop suddenly.

According to the present embodiment, the state obtaining unit 812 and the lifetime estimating unit 813 are disposed outside the image sensor 400. However, the state obtaining unit 812 and the lifetime estimating unit 813 may be disposed inside the image sensor 400. In particular, in the case where the state obtaining unit 812 is disposed on the same semiconductor substrate as the image sensor 400, the state obtaining unit 812 is disposed in the same operation environment as the image sensor 400, and the lifetime can be estimated with more precision.

Fifth Embodiment

An image capturing apparatus according to the present embodiment, mainly differences from the fourth embodiment will be described.

Figure 9:
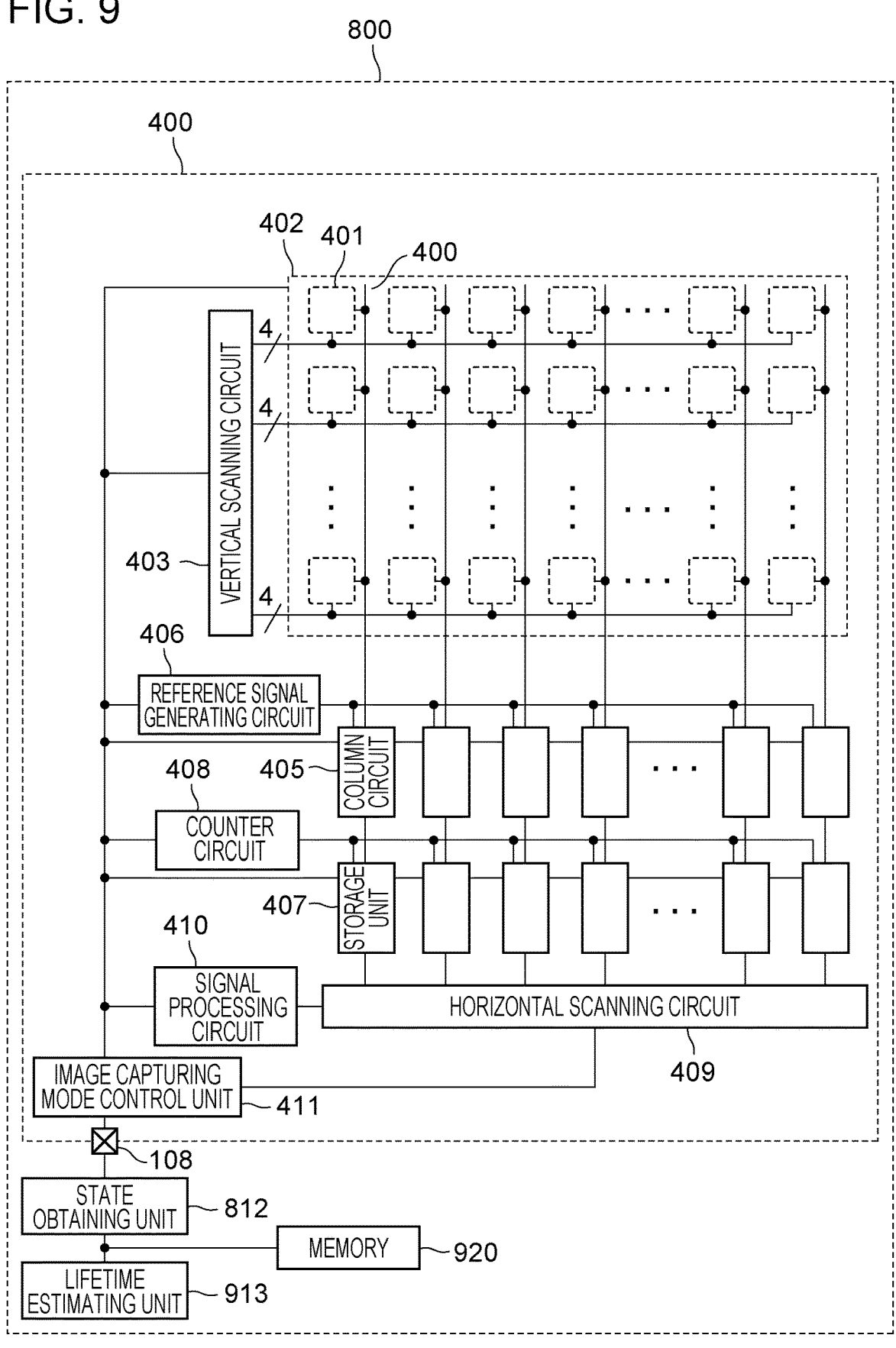
FIG. 9 illustrates the structure of an image capturing apparatus.

FIG. 9 illustrates the structure of the image capturing apparatus according to the present embodiment. The image capturing apparatus according to the present embodiment further includes a memory 920 relative to the image capturing apparatus according to the fourth embodiment.

The memory 920 holds the history information in relation to the state of the operation.

A lifetime estimating unit 913 according to the present embodiment estimates the remaining lifetime by using the history information that is held by the memory 920 and information that is outputted from the state obtaining unit 812 and generates the remaining lifetime information. Examples of the history information include a history of the image capturing mode of the image capturing apparatus and the cumulative time of the operation of the image capturing apparatus. The image capturing mode includes a period (frame rate) in which the image sensor 400 outputs an image signal, an image size, and whether the focus detection function is performed.

In an example of the operation, the remaining lifetime that is estimated by the lifetime estimating unit 913 by using all or a part of expression (1) to expression (5) as described according to the fourth embodiment is corrected by using the history information that is held by the memory 920.

In another example of the operation, the memory 920 holds the IdRATIO that is obtained by using expression (5) whenever the remaining lifetime is estimated. The lifetime estimating unit 913 obtains the variation in the IdRATIO over time by using the IdRATIO at each time that is held by the memory 920. From the variation in the IdRATIO over time, time at which the IdRATIO becomes 10% or more is estimated (that is, the remaining lifetime is estimated). Consequently, the remaining lifetime can be estimated with more precision.

Values that are stored in the memory 920 are not limited to the drain current Id of the transistor but may be values in all or a part of expression (1) to expression (5).

The memory 920 may be located outside the image capturing apparatus 800. The memory 920 is preferably a non-volatile memory. In the case where the memory 920 is disposed outside the image capturing apparatus 800, processing of manufacturing the image capturing apparatus 800 and the memory 920 can be divided. Consequently, restrictions on a process of manufacturing the image capturing apparatus 800 and a process of manufacturing the memory 920 can be decreased.

The image capturing apparatus according to the present embodiment thus includes the memory 920 that holds the history information in relation to the state of the operation. The remaining lifetime can be estimated with precision by using the history information that is held by the memory 920.

Each image capturing apparatus described according to the above embodiments can be a multi-layer type sensor in which chips are stacked. For example, a first chip may include the pixel array 402, and a second chip may include the column circuits 405, the reference signal generating circuit 406, the storage units 407, the counter circuit 408, the horizontal scanning circuit 409, the signal processing circuit 410, and the image capturing mode control unit 411. In this case, the second chip may further include the lifetime estimating unit 109. A third chip that includes a signal processing unit that generates an image may also be stacked. In this case, the third chip may include the lifetime estimating unit 109.

Sixth Embodiment

Figure 10:
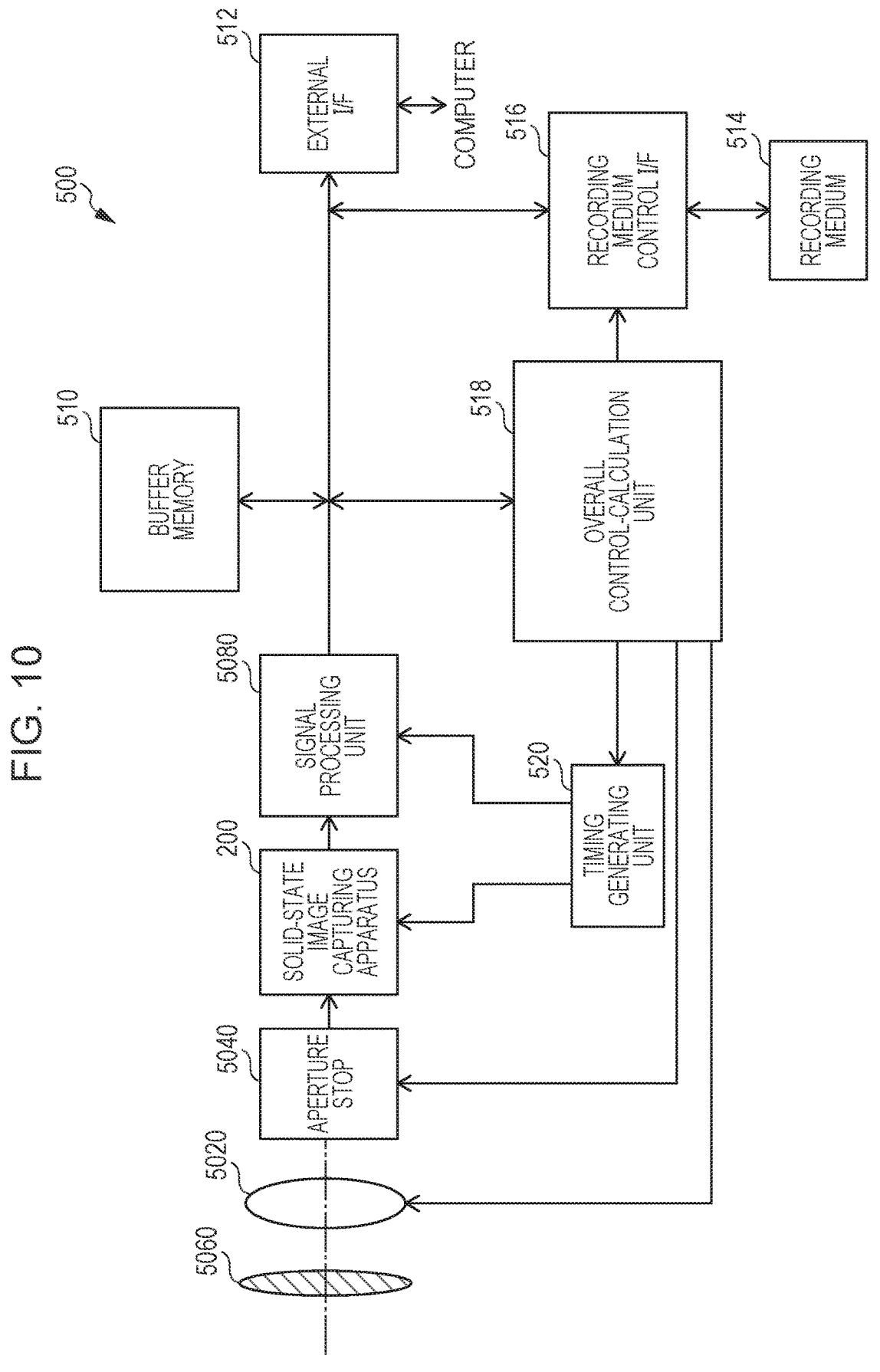
FIG. 10 illustrates the structure of an image capturing system.

FIG. 10 is a block diagram illustrating the structure of an image capturing system 500 according to the present embodiment. The image capturing system 500 according to the present embodiment includes an image capturing apparatus 200 that has the same structure as one of the image capturing apparatuses according to the above embodiments. Specific examples of the image capturing system 500 include a digital still camera, a digital camcorder, and a monitoring camera. FIG. 10 illustrates an example of the structure of a digital still camera that uses one of the image capturing apparatuses according to the above embodiments as the image capturing apparatus 200.

The image capturing system 500 illustrated in FIG. 10 by way of example includes the image capturing apparatus 200, a lens 5020 that images an optical image of the object on the image capturing apparatus 200, an aperture stop 5040 that enables the amount of light that passes through the lens 5020 to be variable, and a barrier 5060 that protects the lens 5020. The lens 5020 and the aperture stop 5040 are optical systems that focus light on the image capturing apparatus 200.

The image capturing system 500 also includes a signal processing unit 5080 that processes an output signal that is outputted from the image capturing apparatus 200. The signal processing unit 5080 corrects and compresses an input signal in various ways as needed and performs output-signal processing. The signal processing unit 5080 may have a function of carrying out AD conversion of the output signal that is outputted from the image capturing apparatus 200. In this case, an AD conversion circuit is not necessarily included inside the image capturing apparatus 200.

The image capturing system 500 also includes a buffer memory 510 in which image data is temporarily stored and an external interface (external I/F) 512 for communication with, for example, an external computer. The image capturing system 500 also includes a recording medium 514 such as a semiconductor memory that is used to record or read image capturing data and a recording medium control interface (recording medium control I/F) 516 that is used for recording to or reading from the recording medium 514. The recording medium 514 may be contained in the image capturing system 500 and may be removable and installable.

The image capturing system 500 also includes an overall control-calculation unit 518 that makes various kinds of calculations and controls the entire digital still camera and a timing generating unit 520 that outputs a various kinds of timing signals to the image capturing apparatus 200 and the signal processing unit 5080. The timing signals may be inputted from the outside. It is only necessary for the image capturing system 500 to include at least the image capturing apparatus 200, the signal processing unit 5080 that processes the output signal that is outputted from the image capturing apparatus 200. The overall control-calculation unit 518 and the timing generating unit 520 may perform a part or the whole of the control function of the image capturing apparatus 200.

The image capturing apparatus 200 outputs an image signal to the signal processing unit 5080. The signal processing unit 5080 performs predetermined signal processing on the image signal that is outputted from the image capturing apparatus 200 and outputs image data. The signal processing unit 5080 generates an image by using the image signal.

The use of image capturing apparatuses according to the above embodiments to form the image capturing system enables the image capturing system to obtain an image having improved quality.

Seventh Embodiment

An image capturing system according to the present embodiment and a moving object will be described with reference to FIGS. 11A, 11B and FIG. 12.

Figure 11A:
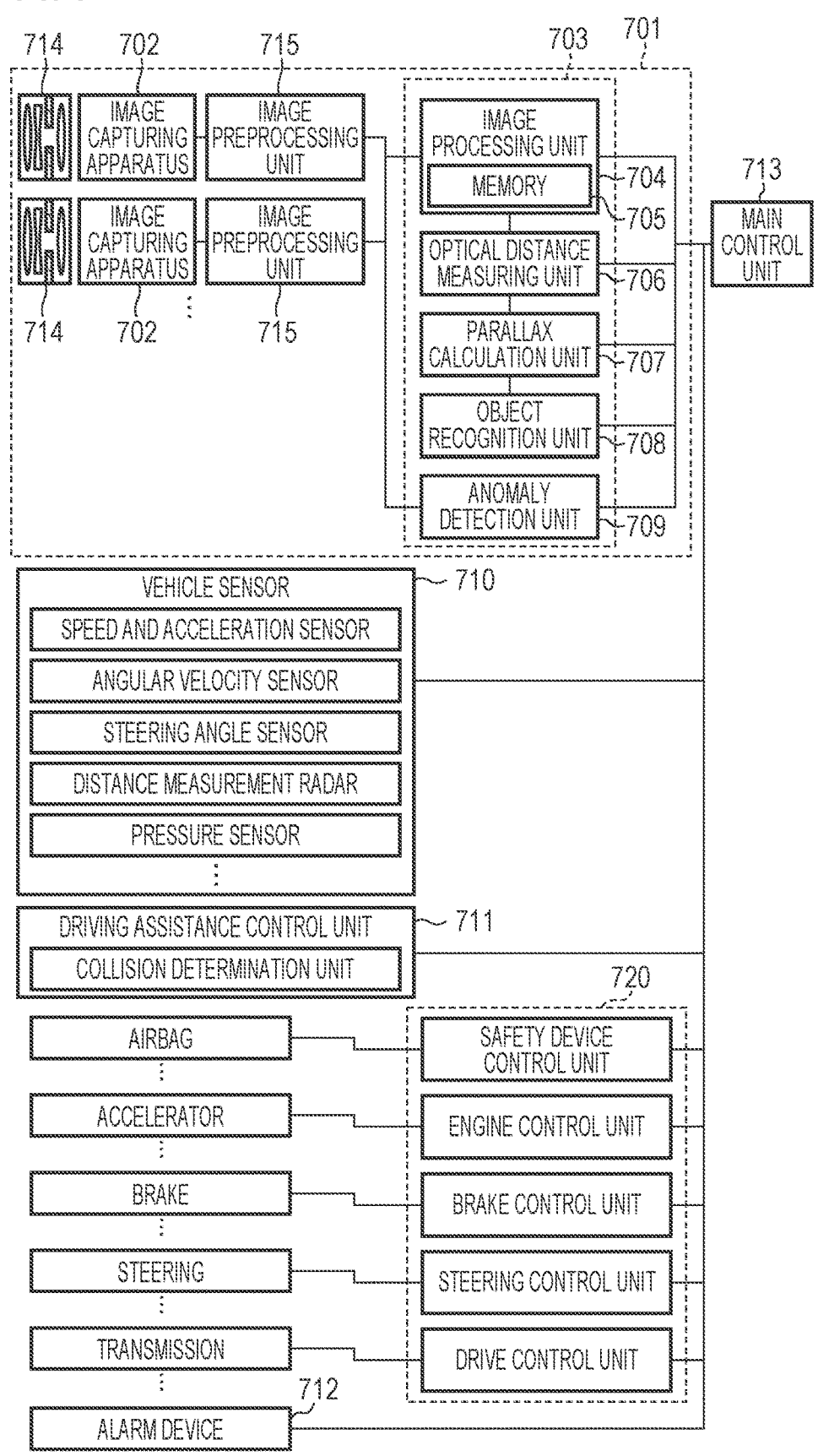
FIG. 11A illustrates the structure of a moving object.
Figure 12:
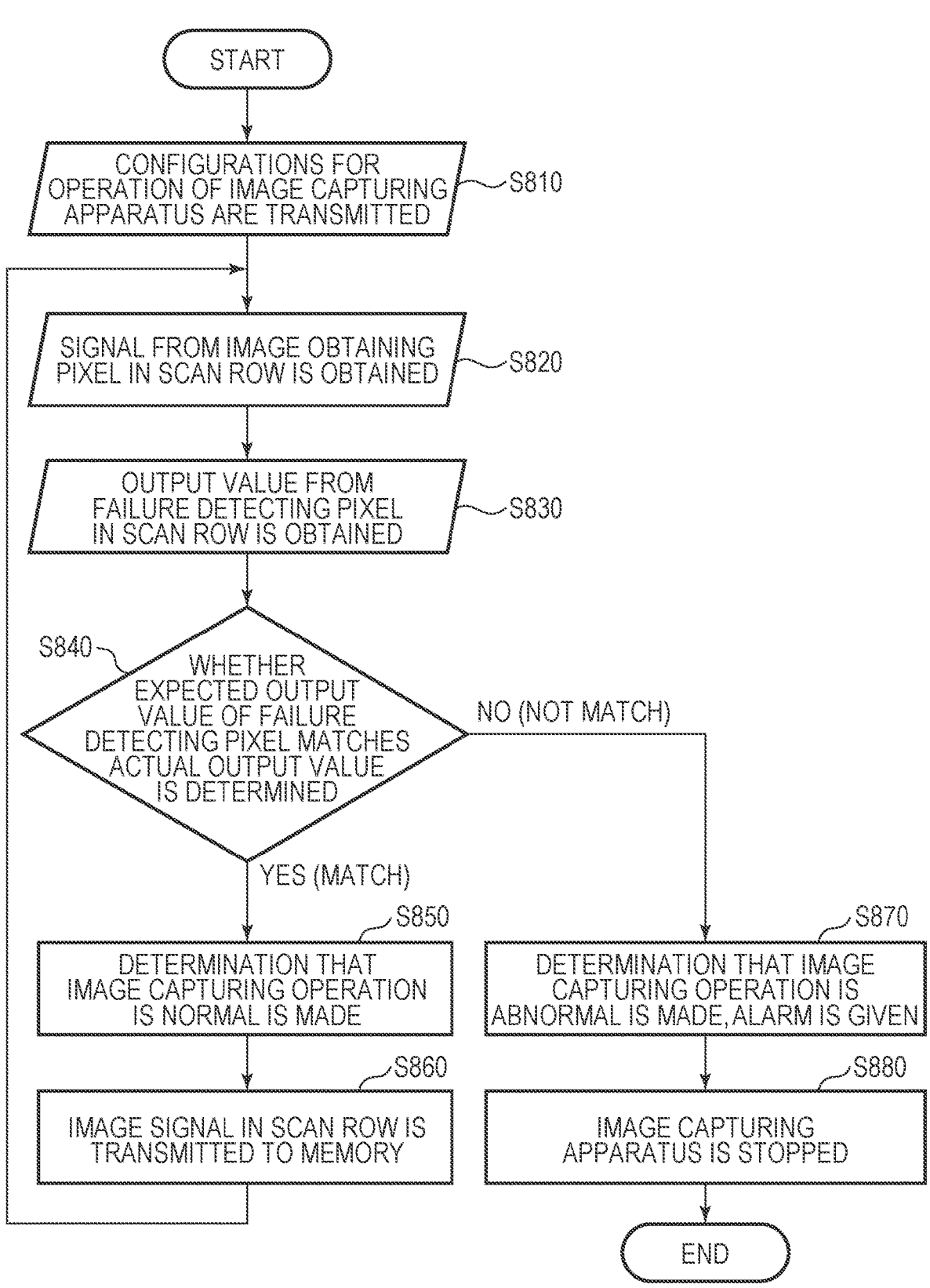
FIG. 12 illustrates the operation of an image capturing system.

FIGS. 11A and 11B schematically illustrate examples of the structure of the image capturing system according to the present embodiment and the moving object. FIG. 12 is a flowchart illustrating the operation of the image capturing system according to the present embodiment.

In an example described according to the present embodiment, the image capturing system relates to a vehicle-mounted camera. FIGS. 11A and 11B illustrate examples of a vehicle system and the image capturing system that is mounted thereon. An image capturing system 701 includes image capturing apparatuses 702, image preprocessing units 715, an integrated circuit 703, and optical systems 714. The optical systems 714 forms an optical image of the object on the image capturing apparatuses 702. The image capturing apparatuses 702 convert the optical image of the object that is formed by the optical systems 714 into electrical signals. Each image capturing apparatus 702 is one of the image capturing apparatuses according to the above embodiments. The image preprocessing units 715 perform predetermined signal processing on signals that are outputted from the image capturing apparatuses 702. The function of the image preprocessing units 715 may be incorporated in the image capturing apparatuses 702. The image capturing system 701 includes at least two sets of the optical systems 714, the image capturing apparatuses 702, and the image preprocessing units 715. The outputs from the sets of the image preprocessing units 715 are inputted into the integrated circuit 703.

The integrated circuit 703 is used for the image capturing system and includes an image processing unit 704 that includes a memory 705, an optical distance measuring unit

706, a parallax calculation unit 707, an object recognition unit 708, and an anomaly detection unit 709. The image processing unit 704 performs image processing such as a development process or defect correction on the output signals of the image preprocessing units 715. The memory 705 stores first record of a captured image and the position of a defect of an imaging pixel. The optical distance measuring unit 706 is used for focus on the object and distance measurement. The parallax calculation unit 707 calculates parallax (phase difference of a parallax image) from multiple image data that is obtained by the image capturing apparatuses 702. The object recognition unit 708 recognizes the subject such as a car, a road, a sign, or a person. The anomaly detection unit 709 reports anomaly to a main control unit 713 when detecting the anomaly of the image capturing apparatuses 702.

The integrated circuit 703 may be built with an exclusively designed hardware, may be built with a software module, or may be built with a combination thereof. Alternatively, the integrated circuit 703 may be built with, for example, a FPGA (Field Programmable Gate Array) or an ASIC (Application Specific Integrated Circuit) or may be built with a combination thereof.

The main control unit 713 manages and controls operation of, for example, the image capturing system 701, a vehicle sensor 710, and a control unit 720. The main control unit 713 may not be included, and the image capturing system 701, the vehicle sensor 710, and the control unit 720 can include respective communication interfaces and can transmit and receive a control signal via a communication network (for example, a CAN standard).

The integrated circuit 703 has a function of receiving a control signal from the main control unit 713 or transmitting a control signal or a configuration value to each image capturing apparatus 702 by using its own control unit. For example, the integrated circuit 703 transmits configurations for pulse-driving a voltage switch 13 in the image capturing apparatus 702, configurations for switching the voltage switch 13 for every frame, or other configurations.

The image capturing system 701 is connected to the vehicle sensor 710 and can detect a state of a vehicle that is running such as a vehicle speed, a yaw rate, and a steering angle, and states of an environment outside the vehicle, another vehicle, or an obstacle. The vehicle sensor 710 also functions as a distance information obtaining unit that obtains information about a distance to the object based on the parallax image. The image capturing system 701 is connected to a driving assistance control unit 711 that assists a driving in various ways such as automatic steering, automatic cruising, and a function of preventing a collision. In particular, regarding a collision determination function, whether a vehicle collides with another vehicle or an obstacle is presumed, and whether the vehicle collides is determined, based on the result of detection of the image capturing system 701 or the vehicle sensor 710. Consequently, in the case where the collision is presumed, avoidance control is started, and a safety device is activated in the collision.

The image capturing system 701 is also connected to an alarm device 712 that gives an alarm to the driver, based on the result of determination of a collision determination unit. For example, in the case where the collision determination unit has determined that there is a high possibility of a collision, the main control unit 713 controls the vehicle to avoid colliding or to reduce damage, for example, in a manner in which the brake is applied, an accelerator is released, or an engine output is reduced. The alarm device 712 gives an alarm to a user, for example, in a manner in which the alarm is given by using, for example, a voice, alarm information is displayed on a screen of a display of, for example, a car navigation system or a meter panel, or a sheet belt or a steering wheel is vibrated.

According to the present embodiment, the image capturing system 701 takes a picture of the vicinity of the vehicle, for example, the front or rear thereof. FIG. 11B illustrates an example of the arrangement of the image capturing system 701 in the case where the image capturing system 701 takes the picture of the front of the vehicle.

The two image capturing apparatuses 702 are disposed at the front of a vehicle 700. Specifically, the two image capturing apparatuses 702 are disposed symmetrically with each other with respect to a symmetric axis that coincides with a center line that extends in a direction in which the vehicle 700 runs forwards or backwards or a center line of an external shape (for example, the width of the vehicle). This is preferable when information about the distance between the vehicle 700 and the object is obtained or the possibility of a collision is determined. The image capturing apparatuses 702 are preferably disposed at positions at which the view of the driver is not obstructed when the driver sights circumstances outside the vehicle 700 from a driver's seat. The alarm device 712 is preferably disposed at a position at which the driver easily sees the alarm device 712.

Failure detecting operation of the image capturing apparatuses 702 of the image capturing system 701 will now be described with reference to FIG. 12. The failure detecting operation of the image capturing apparatuses 702 is performed through steps S810 to S880 illustrated in FIG. 12.

At step S810, the configurations of the image capturing apparatuses 702 during a startup process are set. That is, the configurations for the operation of the image capturing apparatuses 702 are transmitted from a location (for example, the main control unit 713) outside the image capturing system 701 or inside the image capturing system 701, and the image capturing operation and the failure detecting operation of the image capturing apparatuses 702 are started.

Subsequently, at step S820, pixel signals are obtained from effective pixels. At step S830, output values are obtained from failure detecting pixels that are disposed for detecting failure. The failure detecting pixels include respective photoelectric converters as in the effective pixels. A predetermined voltage is stored in the photoelectric converters. The failure detecting pixels output signals corresponding to the voltage stored in the photoelectric converters. The order of the step S820 and the step S830 may be inverted.

Subsequently, at step S840, whether expected output values of the failure detecting pixels match the actual output values from the failure detecting pixels is determined.

In the case where the result of determination at step S840 is that the expected output values match the actual output values, the processing proceeds to step S850, in which determination that the image capturing operation is normal is made, and the processing proceeds to step S860. At step S860, the pixel signals in a scan row are transmitted to the memory 705 and are temporarily stored therein. Subsequently, the processing returns to step S820, and the failure detecting operation continues.

In the case where the result of determination at step S840 is that the expected output values do not match the actual output values, the processing proceeds to step S870. At step S870, determination that the image capturing operation is abnormal is made, and an alarm is given to the main control unit 713 or the alarm device 712. The alarm device 712 displays detection of anomaly on the display. Subsequently, at step S880, the image capturing apparatuses 702 are stopped, and the operation of the image capturing system 701 ends.

An example described according to the present embodiment illustrates that the flowchart is looped for every row. The flowchart, however, may be looped for every set of rows. The failure detecting operation may be performed for every frame.

At step S870, the alarm may be given to a location outside the vehicle via a wireless network.

The control described according to the present embodiment is exerted to avoid a collision with another vehicle. The present embodiment can be used to control automatic driving for following another vehicle or to control automatic driving for preventing the vehicle from moving out of a lane. The image capturing system 701 is not limited to the vehicle such as a car and can be used for a moving object (moving device) such as a ship, an aircraft, or an industrial robot. In addition to the moving object, the image capturing system 701 may be used for instrument used for recognizing objects in a wide range such as an intelligent transport system (ITS).

[Modification]

The present invention is not limited to the above embodiments. Various modifications can be made.

For example, embodiments of the present invention include an embodiment of a combination of a part of one of the above embodiments and the other embodiment, and an embodiment that is obtained by replacing a part of one of the above embodiments with a part of the other embodiment.

The above embodiments are specifically described by way of example to carry out the present invention. The technical scope of the present invention is not interpreted in a limited range because of the above embodiments. That is, the present invention can be carried out as various embodiments without departing from the technical concept or principal features thereof.

According to the present invention, the remaining lifetime of a semiconductor apparatus can be increased.

Also, according to the present invention, an image capturing apparatus that can estimate remaining lifetime after an image capturing operation is actually performed is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image capturing apparatus comprising:

an image sensor that comprises pixels that are arranged in rows and in columns and that include respective photoelectric converters, and performs an image capturing operation for reading out signals of the pixels; and a lifetime estimating unit that obtains remaining lifetime information on the image sensor, wherein the image sensor performs the image capturing operation multiple times, the lifetime estimating unit obtains the remaining lifetime information after the image capturing operation is performed multiple times, the lifetime estimating unit obtains first information that is the remaining lifetime information at first time in a period in which the image capturing operation is performed multiple times, the lifetime estimating unit obtains second information that is the remaining lifetime information at second time which is after the first time and in the period, and the lifetime estimating unit estimates a remaining lifetime of the image sensor from the first information and the second information.

2. The image capturing apparatus according to claim 1, wherein the lifetime estimating unit obtains operation information that represents a state of an operation of the image sensor, and the lifetime estimating unit obtains the remaining lifetime information by using the operation information.

3. The image capturing apparatus according to claim 2, wherein the operation information represents a temperature of the image sensor.

4. The image capturing apparatus according to claim 2, wherein the operation information represents a cumulative time of the operation of the image sensor.

5. The image capturing apparatus according to claim 2, wherein the operation information represents electric current consumption of the image sensor.

6. The image capturing apparatus according to claim 1, wherein the image capturing apparatus includes a memory that stores history information that represents a history of the operation of the image sensor, and the lifetime estimating unit corrects the remaining lifetime information by using the history information.

7. The image capturing apparatus according to claim 6, wherein the history information is information that represents a cumulative time of an operation of the image capturing apparatus.

8. The image capturing apparatus according to claim 1, wherein the image sensor includes a transistor, and the lifetime estimating unit obtains the remaining lifetime information, based on a variation in a drain current that flows through the transistor over time.

9. The image capturing apparatus according to claim 1, wherein the lifetime estimating unit obtains the remaining lifetime information in a period in which each photoelectric converter accumulates an electric charge based on incident light.

10. The image capturing apparatus according to claim 1, further comprising:

a processing unit that processes signals from the pixels, wherein the lifetime estimating unit obtains the remaining lifetime information in a period in which the processing unit processes the signals from the pixels.

11. An image capturing system comprising:

the image capturing apparatus according to claim 1; and a signal processing unit that processes a signal that is outputted by the image capturing apparatus.

12. A moving object system comprising:

the image capturing apparatus according to claim 1; and a control unit that controls movement of the moving object.

13. An image capturing apparatus comprising:

an image sensor that comprises pixels that are arranged in rows and in columns and that include respective photoelectric converters, and performs an image capturing operation for reading out signals of the pixels; and a lifetime estimating unit that obtains remaining lifetime information on the image sensor, wherein the image sensor performs the image capturing operation multiple times, the lifetime estimating unit obtains the remaining lifetime information after the image capturing operation is performed multiple times, the lifetime estimating unit obtains operation information that represents a state of an operation of the image sensor, the lifetime estimating unit obtains the remaining lifetime information by using the operation information, and wherein the operation information represents a frame rate of the image sensor.

14. An image capturing system comprising:

the image capturing apparatus according to claim 13; and a signal processing unit that processes a signal that is outputted by the image capturing apparatus.

15. A moving object system comprising:

the image capturing apparatus according to claim 13; and a control unit that controls movement of the moving object.

16. An image capturing apparatus comprising:

an image sensor that comprises pixels that are arranged in rows and in columns and that include respective photoelectric converters, and performs an image capturing operation for reading out signals of the pixels;

a lifetime estimating unit that obtains remaining lifetime information on the image sensor; and a driving control unit that controls drive of the image sensor, wherein the image sensor performs the image capturing operation multiple times, the lifetime estimating unit obtains the remaining lifetime information after the image capturing operation is performed multiple times, in a case where the remaining lifetime information represents a first length, the driving control unit drives the image sensor in a first condition, and in a case where the remaining lifetime information represents a second length shorter than the first length, the driving control unit drives the image sensor in a second condition in which a remaining lifetime of the image sensor is longer than that in a case where the image sensor is driven in the first condition.

17. The image capturing apparatus according to claim 16, wherein the image sensor includes a scanning circuit that performs vertical scanning in which the pixels in the rows are scanned in a unit of the rows, the first condition is a condition in which the vertical scanning is performed a first number of times per unit time, and the second condition is a condition in which the vertical scanning is performed a second number of times smaller than the first number of times per unit time.

18. The image capturing apparatus according to claim 16, wherein in a case where the driving control unit drives the image sensor in the first condition, the lifetime estimating unit obtains the remaining lifetime information at a first interval, and in a case where the driving control unit drives the image sensor in the second condition, the lifetime estimating unit obtains the remaining lifetime information at a second interval shorter than the first interval.

19. The image capturing apparatus according to claim 16, wherein the first condition is a condition in which an operating frequency of the image sensor is a first frequency, and the second condition is a condition in which the operating frequency of the image sensor is a second frequency lower than the first frequency.

20. The image capturing apparatus according to claim 16, wherein the first condition is a condition in which a power supply voltage that is applied to the image sensor is a first voltage, and the second condition is a condition in which the power supply voltage that is applied to the image sensor is a second voltage an absolute value of which is smaller than that of the first voltage.

21. An image capturing system comprising:

the image capturing apparatus according to claim 16; and a signal processing unit that processes a signal that is outputted by the image capturing apparatus.

22. A moving object system comprising:

the image capturing apparatus according to claim 16; and a control unit that controls movement of the moving object.

\* \* \* \* \*